United States Patent
Chu et al.

(10) Patent No.: US 6,940,712 B2
(45) Date of Patent: *Sep. 6, 2005

(54) ELECTRONIC DEVICE SUBSTRATE ASSEMBLY WITH MULTILAYER IMPERMEABLE BARRIER AND METHOD OF MAKING

(75) Inventors: Richard C. Chu, Hopewell Junction, NY (US); Michael J. Ellsworth, Jr., Lagrangeville, NY (US); Robert E. Simons, Poughkeepsie, NY (US); Prabjit Singh, Poughkeepsie, NY (US); Paul A. Zucco, Red Hook, NY (US)

(73) Assignee: International Business Machines Corporation, Armonk, NY (US)

( * ) Notice: Subject to any disclaimer, the term of this patent is extended or adjusted under 35 U.S.C. 154(b) by 311 days.

This patent is subject to a terminal disclaimer.

(21) Appl. No.: 10/197,661

(22) Filed: Jul. 17, 2002

(65) Prior Publication Data

US 2004/0012914 A1 Jan. 22, 2004

(51) Int. Cl.⁷ ................................................. H05K 7/20
(52) U.S. Cl. ...................... 361/679; 361/719; 165/80.3; 165/104.33
(58) Field of Search .................................. 361/679–687, 361/715–720, 699, 704; 257/687, 710, 713–714; 438/613, 118–119, 124; 165/104.33, 185; 29/830, 832, 840, 890.03

(56) References Cited

U.S. PATENT DOCUMENTS

| | | | |
|---|---|---|---|
| 4,381,032 A | 4/1983 | Cutchaw | 165/46 |
| 4,531,146 A | 7/1985 | Cutchaw | 357/82 |
| 4,825,284 A | 4/1989 | Soga et al. | 357/80 |
| 4,879,629 A | 11/1989 | Tustaniwskyj et al. | 361/385 |
| 4,888,663 A | 12/1989 | Longerich et al. | 361/385 |
| 5,294,830 A | 3/1994 | Young et al. | 257/714 |
| 5,604,377 A | 2/1997 | Palagonia | 257/685 |
| 5,655,290 A | 8/1997 | Moresco et al. | 29/830 |
| 5,656,862 A | 8/1997 | Papathomas et al. | 257/778 |
| 5,659,203 A | 8/1997 | Call et al. | 257/778 |

(Continued)

FOREIGN PATENT DOCUMENTS

JP 63313846 A2 12/1988

OTHER PUBLICATIONS

"Electronic Device Substrate Assembly with Impermeable Barrier and Method of Making", Chu et al, filed Nov. 9, 2001, U.S. Appl. No. 10/047,497.

(Continued)

Primary Examiner—Hung Van Duong
(74) Attorney, Agent, or Firm—Andrew J. Wojnicki, Jr.; Lily Neff

(57) ABSTRACT

An electronic module, substrate assembly, and fabrication method, the assembly providing thermal conduction between an electronic device to be cooled and an aqueous coolant, while maintaining physical separation between the coolant and electronic device. The assembly includes a substrate, one or more electronic devices to be cooled, and a multilayer, impermeable barrier. The multilayer barrier includes a first layer, providing mechanical support for a second layer. The second, thinner layer provides an impermeable barrier, and a high effective thermal conductivity path between an electronic device and a cooling fluid in contact with an upper surface of the second barrier layer. Mechanical stresses are minimized by appropriate material selection for the first layer, and a thin second layer. When incorporated into an electronic module assembly including a module cap, the substrate assembly provides physical separation between a cooling fluid introduced into the module cap, and both the substrate and electronic devices.

29 Claims, 14 Drawing Sheets

U.S. PATENT DOCUMENTS

| | | | |
|---|---|---|---|
| 5,668,059 A | 9/1997 | Christie et al. | 438/118 |
| 5,801,437 A | 9/1998 | Burns | 257/685 |
| 5,854,507 A | 12/1998 | Miremadi et al. | 257/686 |
| 5,930,597 A | 7/1999 | Call et al. | 438/106 |
| 5,982,031 A | 11/1999 | Stockmeier | 257/723 |
| 5,998,859 A | 12/1999 | Griswold et al. | 257/679 |
| 6,052,284 A | 4/2000 | Suga et al. | 361/699 |
| 6,075,288 A | 6/2000 | Akram | 257/706 |
| 6,587,345 B2 * | 7/2003 | Chu et al. | 361/719 |
| 6,624,060 B2 * | 9/2003 | Chen et al. | 438/613 |

OTHER PUBLICATIONS

"Enhanced Air Cooling of Electronic Devices Using Fluid Phase Change Heat Transfer", Chu et al, filed Nov. 9, 2001, U.S. Appl. No. 10/040,680.

"Encapsulant for Fatigue Life Enhancement of Controlled Collapse Chip Connection (C4)" by Wang et al, IEEE 1993, pp. 780–784.

IBM Technical Disclosure Bulletin, vol. 20, No. 11A, Apr. 1978, "Temperature Triggerable Fluid Coupling System For Cooling Semiconductor Dies", by Dorler et al, pp. 4386–4388.

Microelectronics Packaging Handbook, Semiconductor Packaging Part II , by Tummala et al, 1999, Chapter 11, pp. 583–587.

IBM Technical Disclosure Bulletin, vol. 20, No. 2, Jul. 1977, "Liquid Cooled Module with Compliant Membrane" by Loeffel et al, pp. 673–674.

* cited by examiner

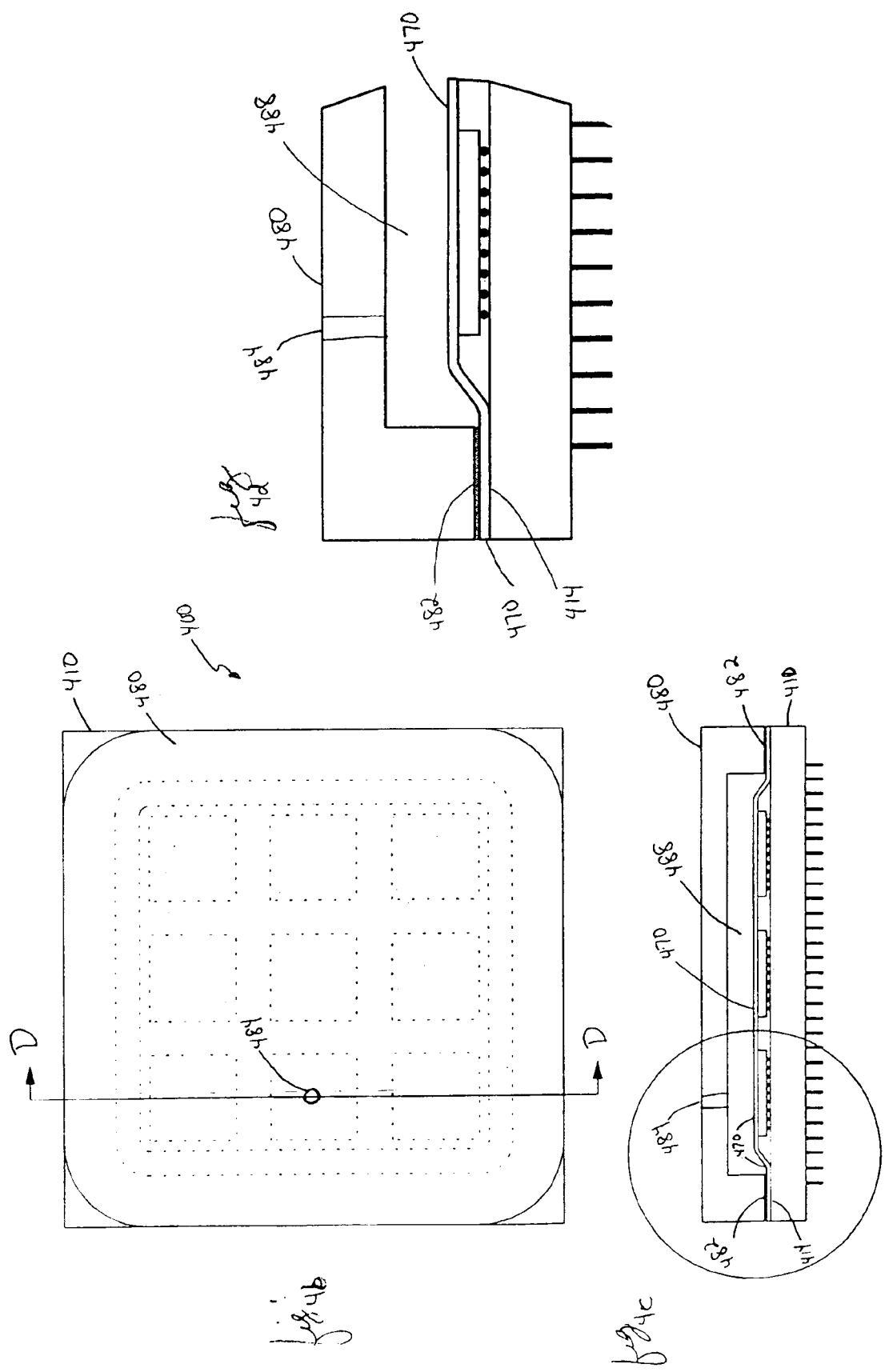

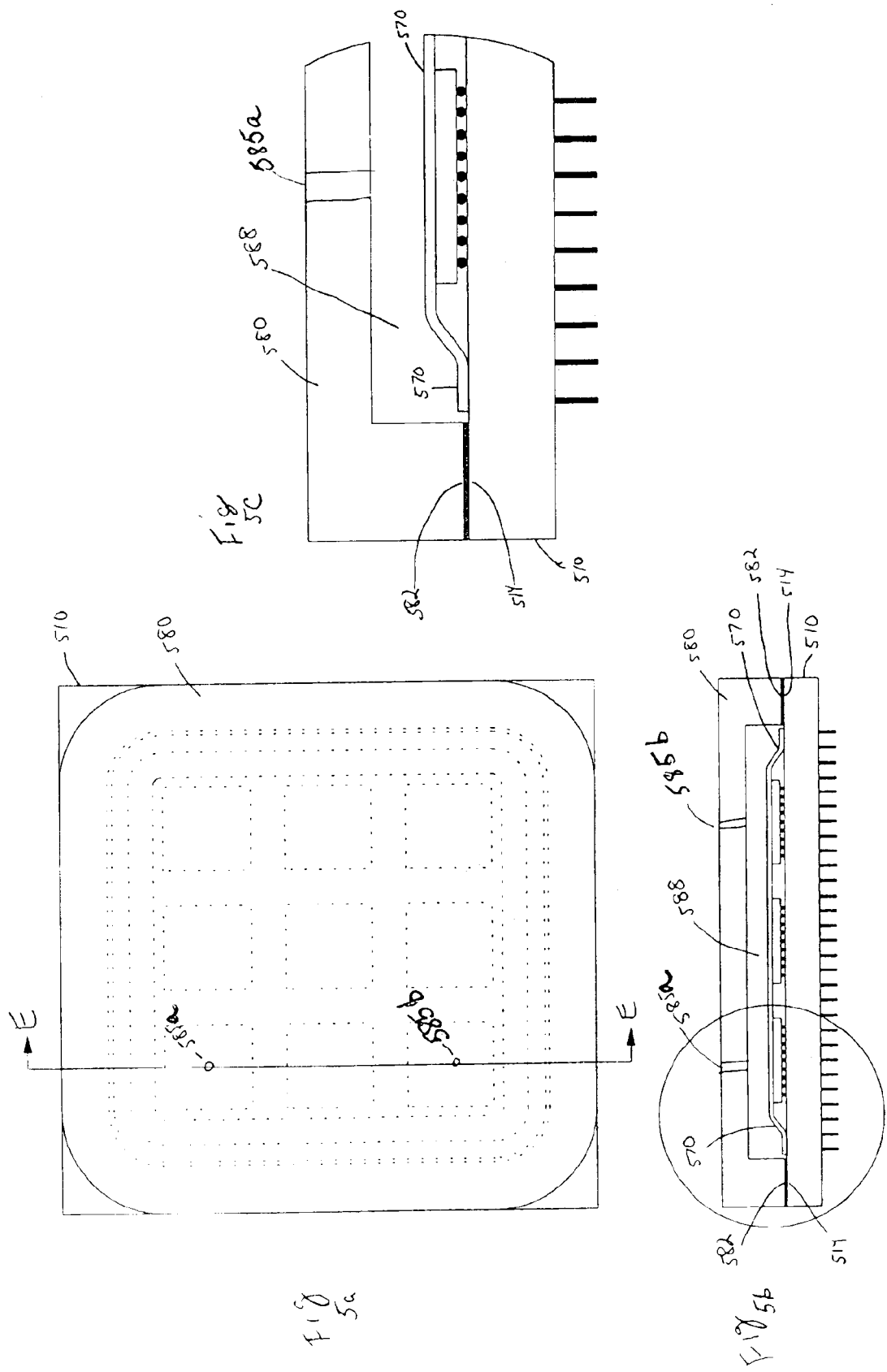

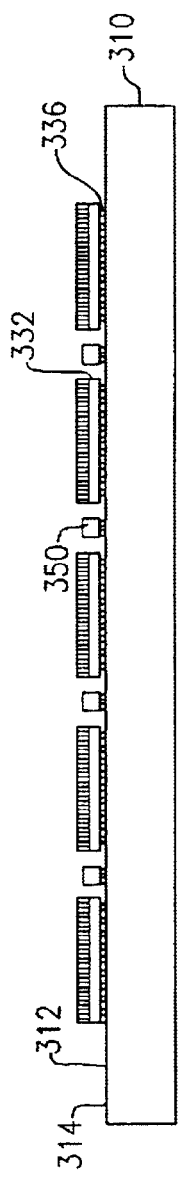
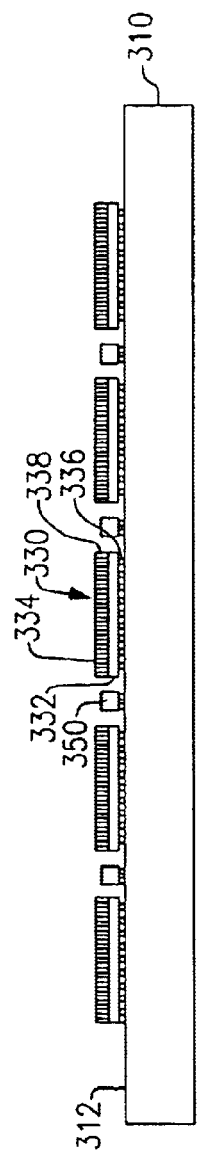
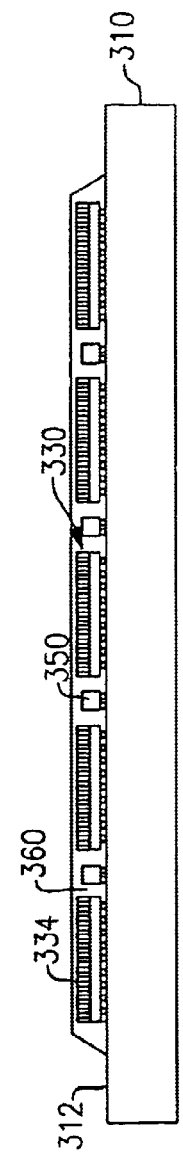
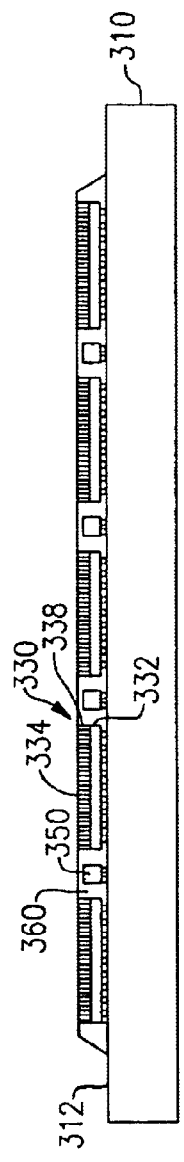
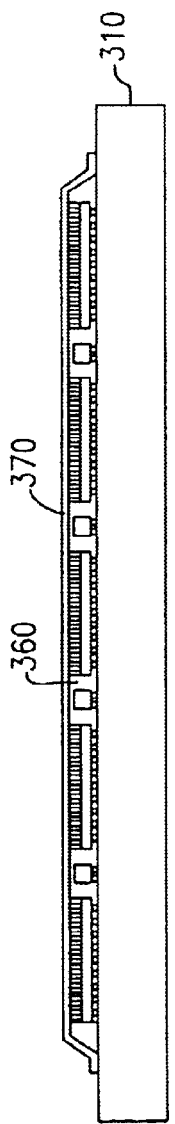

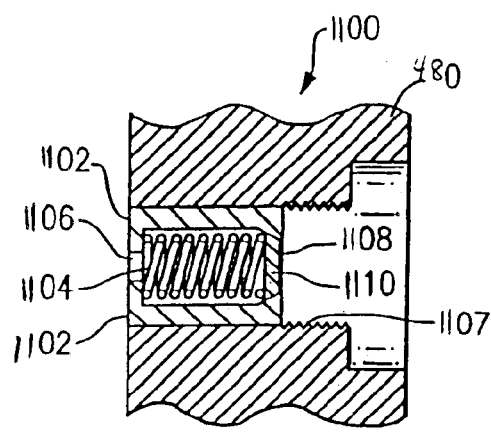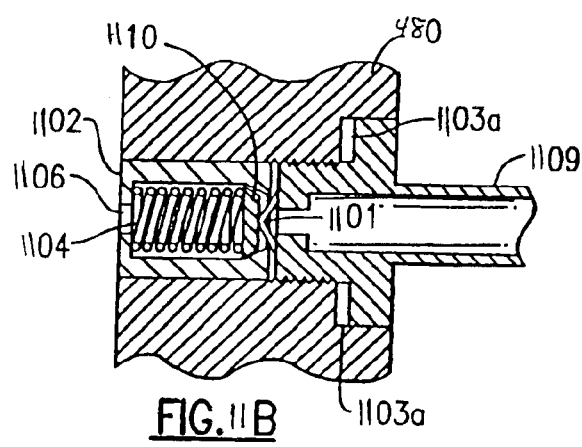
FIG.11A  FIG.11B
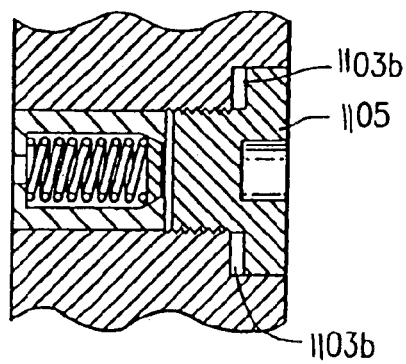
FIG.11C

ELECTRONIC DEVICE SUBSTRATE ASSEMBLY WITH MULTILAYER IMPERMEABLE BARRIER AND METHOD OF MAKING

CROSS REFERENCE TO RELATED APPLICATIONS

This application contains subject matter which is related to the subject matter of the following applications, each of which is assigned to the same assignee as this application and each of which is hereby incorporated herein by reference in its entirety:

"Electronic Device Substrate Assembly with Impermeable Barrier and Method of Making," Chu et al., having, Ser. No. 10/047497, filed Nov. 9, 2001; and "Enhanced Air Cooling of Electronic Devices using Fluid Phase Change Heat Transfer," Chu et al., having, Ser. No. 10/040680, filed Nov. 9, 2001.

FIELD OF THE INVENTION

The present invention relates in general to devices used for removing heat from electronic modules, and methods of constructing such devices. In particular, the present invention relates to a passivated electronic module substrate assembly, which provides a high effective thermal conductivity path between electronic devices to be cooled and a cooling fluid, while preventing contact between the cooling fluid and the electronic devices.

BACKGROUND OF THE INVENTION

As is known, operating electronic devices produce heat. This heat should be removed from the devices in order to maintain device junction temperatures within desirable limits: failure to remove the heat thus produced results in increased device temperatures, potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. First, power dissipation, and therefore heat production, increases as the device operating frequencies increase. Second, increased operating frequencies may be possible at lower device junction temperatures. Finally, as more and more devices are packed onto a single chip, power density (Watts/cm$^2$) increases, resulting in the need to remove more power from a given size chip or module. These trends have combined to create applications where it is no longer desirable to remove the heat from modern devices solely by traditional air cooling methods, such as by using traditional air cooled heat sinks. These trends are likely to continue in the foreseeable future, furthering the need for alternatives to traditional air cooling methods.

One approach to avoiding the limitations of traditional air cooling is to use a cooling fluid. As is known, different fluids provide different cooling capabilities. In particular, fluids such as refrigerants or other dielectric fluids exhibit relatively poor thermal conductivity and specific heat properties, when compared to fluids such as water or other aqueous fluids. Dielectric fluids have an advantage, however, in that they may be placed in direct physical contact with electronic devices and interconnects without adverse affects such as corrosion or electrical short circuits. For example, U.S. Pat No. 6,052,284, entitled "Printed Circuit Board with Electronic Devices Mounted Thereon," describes an apparatus in which a dielectric fluid flows over and around several operating electronic devices, thereby removing heat from the devices. Similar approaches are disclosed in U.S. Pat. No. 5,655,290, entitled "Method for Making a Three-Dimensional Multichip Module," and U.S. Pat. No. 4,888,663, entitled "Cooling System for Electronic Assembly."

Other cooling fluids, such as water or other aqueous fluids, exhibit superior thermal conductivity and specific heat compared to dielectric fluids. Water-based coolants, however, must be kept from physical contact with electronic devices and interconnects, since corrosion and electrical short circuit problems are likely to result from such contact. Various methods have been disclosed for using water-based coolants, while providing physical separation between the coolant and the electronic devices. For example, U.S. Pat. No. 4,531,146, entitled "Apparatus for Cooling High-Density Integrated Circuit Packages," discloses the use of a conductive foil barrier; U.S. Pat. No. 4,879,629, entitled "Liquid Cooled Multi-chip Integrated Circuit Module Incorporating a Seamless Compliant Member for Leakproof Operation," and IBM Technical Disclosure Bulletin Vol. 20, No. 2, July 1977, entitled "Liquid Cooled Module with Compliant Membrane," disclose the use of a flexible barrier with thermal conduction enhancements (thermal studs and heatsinks, respectively); and U.S. Pat. No. 4,381,032, entitled "Apparatus for Cooling High-Density Integrated Circuit Packages," and U.S. Pat. No. 5,294,830, entitled "Apparatus for Indirect Impingement Cooling of Integrated Circuit Chips," disclose the use of flexible barriers, where pistons are used to maintain contact between the barrier and the devices to be cooled.

An additional problem may arise with the use of a barrier, where the barrier material differs from any of the other materials used to construct the electronic module assembly. While solids in general tend to expand with increasing temperature, the rate of expansion for a given temperature change tends to be characteristic of a particular material. This characteristic, known as the thermal coefficient of expansion (TCE), varies from material to material. Therefore, two structures of different materials, when bonded together at one temperature, will tend to expand at different rates as the temperature of the two materials increases. This difference in expansion rates results in mechanical stresses in the structure, as the temperature of the structure varies in either direction from the temperature at which the devices were bonded (zero stress condition). It is desirable, therefore, for a device employing a cooling fluid barrier to minimize stresses produced within permanently bonded structures composed of a plurality of materials.

For the foregoing reasons, therefore, there is a need in the art for a device capable of providing a high effective thermal conductivity path between a device to be cooled and a water-based coolant, while simultaneously maintaining physical separation between the coolant and electronic devices and minimizing mechanical stresses caused by mismatches in the thermal coefficients of expansion of various materials within the device assembly.

SUMMARY

The present invention is directed to a device and method of manufacturing a device capable of providing the thermal benefits of direct liquid cooling, while providing passivation against the chemical and mechanical consequences normally associated with direct or nearly direct contact between cooling fluids and electronic components and substrates.

In particular, the present invention is directed to an electronic module assembly comprising a substrate, at least one electronic device assembly to be cooled, a first passivation layer which substantially occupies the volume around the at least one electronic device assembly, and a second passivation layer sealably affixed to the substrate at its periphery and providing an impermeable barrier, the second passivation layer further being thermally coupled to an upper surface of one or more of the at least one electronic device assemblies.

The present invention is further directed to an electronic module comprising a substrate, at least one electronic device assembly to be cooled, a first passivation layer which substantially occupies the volume around the at least one electronic device assembly, and a second passivation layer sealably affixed to the substrate at its periphery and providing an impermeable barrier, the second passivation layer further being thermally coupled to an upper surface of one or more of the at least one electronic device assemblies, and a module cap sealably affixed to the substrate, the cap and the substrate forming a volume capable of containing a cooling fluid.

The present invention is further directed to a method of making a passivated electronic assembly having a substrate and at least one electronic device assembly, comprising the steps of applying a first passivation layer, where the first passivation layer substantially occupies the volume adjacent to the at least one electronic device assembly, exposing an upper surface of the at least one electronic device assembly, and depositing a second passivation layer over the first passivation layer and over the exposed device assembly upper surface, where the second passivation layer is sealably affixed to the substrate at its periphery and provides an impermeable barrier, and where the second passivation layer is further thermally coupled to an upper surface of one or more of the at least on electronic device assemblies.

It is therefore an object of the present invention to provide an electronic device assembly which is capable of being placed in contact with cooling fluids such as water or other aqueous fluids, providing a high effective thermal conductivity path between electronic devices to be cooled and the cooling fluid, while preventing direct physical contact between the electronic devices to be cooled and the cooling fluid.

It is a further object of the present invention to provide a method of making an electronic device assembly which is capable of being placed in contact with cooling fluids such as water or other aqueous fluids.

It is a further object of the present invention to provide a water-coolable electronic module assembly, characterized by a high effective thermal conductivity path between electronic devices to be cooled and a cooling fluid, while preventing direct contact between the electronic devices and the cooling fluid.

The recitation herein of a list of desirable objects which are met by various embodiments of the present invention is not meant to imply or suggest that any or all of these objects are present as essential features, either individually or collectively, in the most general embodiment of the present invention or in any of its more specific embodiments.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 4B depicts a top view of the electronic module assembly of FIG. 4A;

FIG. 4C depicts a cross section of the electronic module assembly of FIG. 4B, taken along line D—D;

FIG. 4D depicts a detail view of a portion of FIG. 4D;

FIG. 5A depicts an electronic module assembly employing a passivated substrate assembly per an embodiment of the present invention;

FIG. 5B depicts a cross section of the electronic module assembly of FIG. 5A, taken along line E—E;

FIG. 5C depicts a detail view of a portion of FIG. 5B;

FIGS. 9A through 9E depict the initial, intermediate, and final structures produced during a production process employing spacers, per an embodiment of the present invention;

FIG. 11A depicts a filling valve per an embodiment of the present invention;

FIG. 11B depicts the filling valve of FIG. 11A during introduction of cooling fluid, per an embodiment of the present invention; and FIG. 11C depicts the filling valve of FIG. 11A after sealing, per an embodiment of the present invention.

DETAILED DESCRIPTION OF THE INVENTION

In accordance with preferred embodiments of the present invention, a passivated electronic substrate assembly, module assembly, and method of manufacture are described, disclosing a device capable of providing the thermal benefits of direct liquid cooling, while providing passivation against the chemical and mechanical consequences often associated with direct contact between cooling fluids and electronic components and substrates. Passivation is provided by an impermeable, multilayer barrier.

Passivated Electronic Substrate Assembly

Figures 1A, 1B:
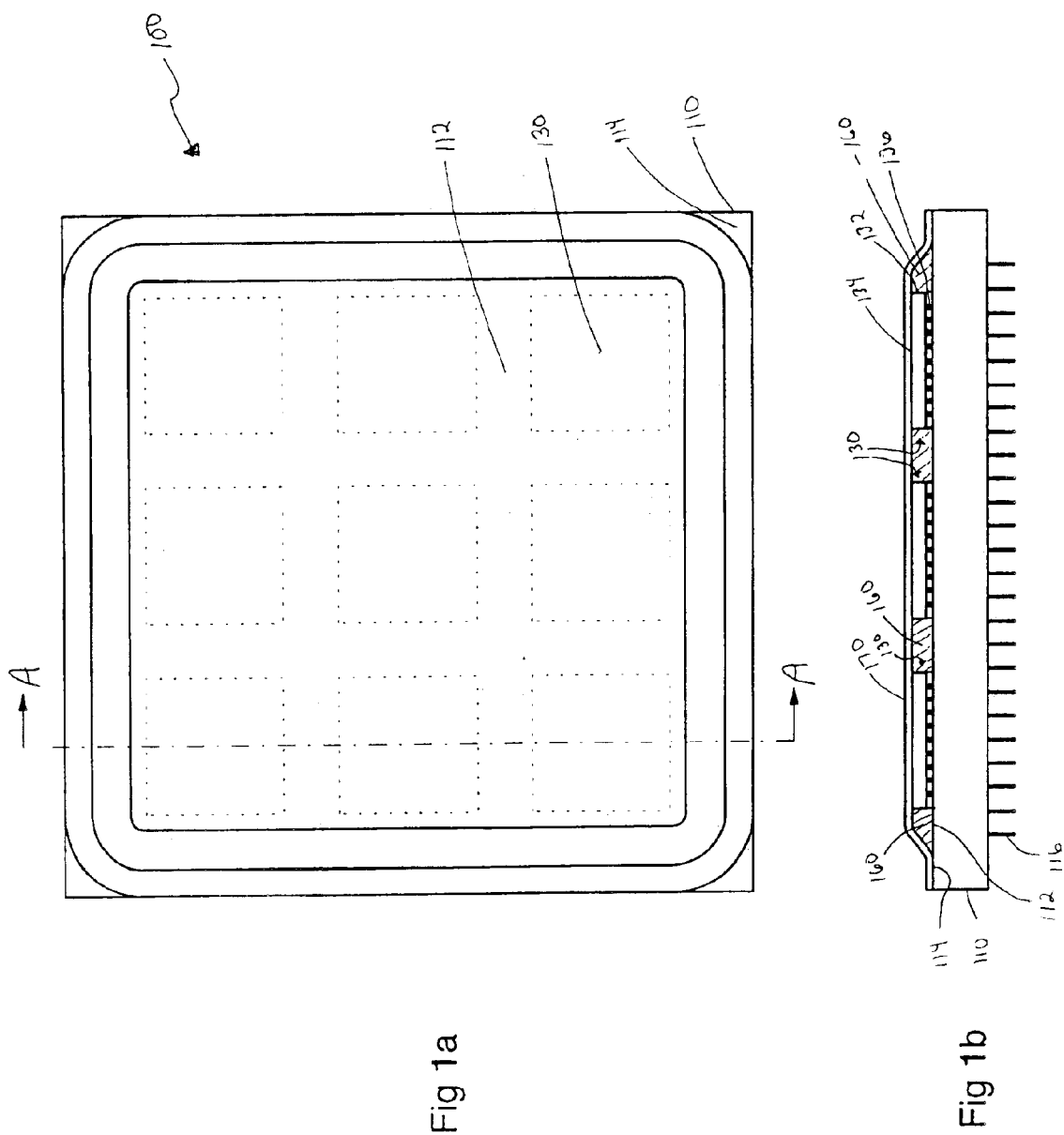
FIG. 1A depicts a top view of a passivated substrate assembly, per an embodiment of the present invention.
FIG. 1B depicts a cross section of the passivated substrate assembly shown in FIG. 1A taken along line A—A.

FIGS. 1A and 1B illustrate a passivated substrate assembly, per one embodiment of the present invention. As shown in FIGS. 1A and 1B, passivated substrate assembly 100 includes a substrate 110, and one or more electronic device assemblies 130. Substrate 110 includes an upper surface 112, to which device assemblies 130 are connected. Substrate upper surface 112 includes a perimeter area 114, surrounding the portion of substrate upper surface 112 that contains device assemblies 130. Substrate 110 further includes a plurality of external electrical connections, such as pins 116, as illustrated in FIG. 1B. In preferred embodiments of the present invention, substrate 110 is composed of ceramic or glass ceramic, however other substrate materials as known in the art may be advantageously used in conjunction with the teachings of the present invention.

As shown in FIG. 1B, electronic device assembly 130 includes an electronic device 132. Electronic device assembly 130 includes an upper surface 134, which, in this embodiment, is the upper surface of electronic device 132. Electronic device assembly 130 further includes electrical connections to substrate upper surface 112, such as solder ball connections 136 (also referred to herein as controlled collapse chip connections, or C4s). Alternatively, device 132 may be connected to substrate 112 through other means, such as wires or leads, provided some portion of device assembly upper surface 134 may be contacted by an electrically conductive material.

FIG. 1B further illustrates the multilayer passivation structure of the present invention. A first passivation layer 160 substantially occupies the volume adjacent to device assemblies 130, within the area bounded by substrate perimeter area 114, and extending vertically from substrate upper surface 112 to approximately the height of device assembly upper surface 134. As illustrated in FIG. 1B, first passivation layer 160 need not occupy the volume between devices 132 and substrate upper surface 112. First passivation layer 160 may, however, optionally occupy the volume between electronic device 132 and substrate upper surface 112, thereby substantially surrounding connections 136 (see first passivation layer embodiment 760, illustrated in FIG. 7C). A second passivation layer 170 is located above the first passivation layer and above the device assembly upper surfaces 134. Second passivation layer 170 is in contact with device upper surfaces 134, and thermally coupled thereto. Second passivation layer 170 is in contact with substrate perimeter area 114, and sealably affixed thereto.

The primary purpose of first passivation layer 160 is to provide mechanical support for second passivation layer 170. Layer 160 should adhere to substrate upper surface 112, and to device assembly 130. In particular, layer 160 should adhere to the sides of device assembly 130, without significant defects, such as gaps, cracks, voids, etc. The upper surface of layer 160 should be relatively smooth and continuous, without significant defects. Furthermore, the surface consisting of the upper surface of layer 160 and device upper surface(s) 134 should be relatively smooth and continuous, without significant defects or discontinuities. In this context, a defect or discontinuity is significant if it impairs the function of layer 170, such as by creating a defect (crack, gap, etc.) in layer 170 through which a cooling fluid might pass. Whether a particular defect is significant, therefore, is likely to depend on the properties of layer 170, such as the materials selected, thickness, number of sublayers, etc. Layer 160 should be a poor electrical conductor, since layer 160 may be in contact with connections 136, or electrical connections on substrate upper surface 112. In preferred embodiments, layer 160 is an electrical insulator. Layer 160 should further exhibit a low dielectric constant, since layer 160 is likely to be in direct or nearly direct contact with conductors on substrate surface 112, or optionally with connections 136, any of which may carry high frequency signals. The thermal transport properties of layer 160 are unimportant; as discussed below, thermal conduction is provided by layer 170. Layer 160 may be composed of a single layer, or multiple layers. Layer 160 may be composed of a single material, or multiple materials. In general, layer 160 may be formed of a variety of materials, such as: silicones, acrylic elastomers, thermoplastic elastomers, thermoplastic copolymers, polysulfide polymers and polyurethanes, thermoplastic polyimides, photosensitive polyimides, polyethersulfones and epoxies. Alternatively, in embodiments of the present invention where layer 160 is formed of a plurality of materials, materials such as engineering glass or silicon may be used to form a portion of layer 160. Other materials having the properties described herein may be substituted by one of skill in the art, and are therefore within the spirit and scope of the present invention.

Layer 160, or a portion thereof, may optionally serve a second purpose, encapsulating connections 136 to reduce mechanical fatigue and extend the useful life of connections 136. Mechanical fatigue may be caused, for example, by subjecting assembly 100 to temperature fluctuations, since assembly 100 is most likely constructed of materials having varying thermal coefficients of expansion. In embodiments of the present invention where mechanical fatigue is a concern, an encapsulant such as, for example an epoxy or a thermoplastic resin (such as polysulfone or polyetherimide) or other suitable encapsulant, may be used to form layer 160, or a portion thereof. Suitable encapsulants are described in, for example, U.S. Pat. No. 5,656,862, Papathomas et al., entitled "Solder Interconnection Structure," issued Aug. 12, 1997, U.S. Pat. No. 5,668,059, Christie et al., entitled "Solder Interconnection Structure and Process for Making," issued Sep. 16, 1997, and U.S. Pat. No. 5,659,203, Call et al., entitled "Reworkable Polymer Chip Encapsulant," issued Aug. 19, 1997, each of which is assigned to the same assignee as the present application and each of which is hereby incorporated herein by reference in its entirety. In such an embodiment, the encapsulant should substantially occupy the volume between electronic device 132 and substrate upper surface 112, thereby substantially surrounding connections 136. The remaining volume of layer 160 may be composed of the same encapsulating material, or may optionally be composed of one or more of the materials previously described (i.e. silicones, acrylic elastomers, thermoplastic elastomers, , etc.).

Second passivation layer 170 serves two purposes. First, layer 170 provides an impermeable and corrosion resistant barrier, capable of being in direct contact with a cooling fluid such as water or other aqueous fluid. Second, layer 170 provides a high effective thermal conductivity path between device assembly upper surface 134 and a cooling fluid in contact with an upper surface of layer 170. In addition, layer 170 and its deposition methods should be compatible with layer 160. Each of these purposes, and the structural and material implications thereof, are discussed herein in detail.

Second passivation layer 170 provides an impermeable and corrosion resistant barrier, capable of being in direct contact with a cooling fluid such as water or other aqueous fluid. From a structural perspective, layer 170 should form a continuous barrier over layer 160 and device assemblies 130. Layer 170 should be of sufficient thickness such that layer 170 remains continuous, even above regions containing minor defects in layer 160, or discontinuities between layer 160 and device assemblies 130. A multilayer structure may be used to improve layer 170 coverage, thereby reducing sensitivity to defects. Layer 170 should adhere to substrate perimeter area 114, forming an impermeable seal. In the region where it bonds to perimeter area 114, layer 170 should form a substantially flat surface of sufficient width to enable the formation of an impermeable seal with a module cap, as discussed herein with reference to FIG. 4. Alternatively, as illustrated in FIGS. 5, a module cap may be bonded directly to substrate perimeter area 114; in such an embodiment, layer 170 covers a portion of substrate perimeter area 114, leaving an outer portion of perimeter area 114 available to bond with a module cap. From a material perspective, layer 170 should be formed of a material that is both impermeable to water, and is resistant to corrosion when in the presence of water or other aqueous fluids. Layer 170 should also adhere to underlying structures, in particular to first passivation layer 160, and device assembly upper surfaces 134.

Second passivation layer 170 provides a high effective thermal conductivity path between device assembly upper surface 134 and a cooling fluid in contact with an upper surface of layer 170. From a structural perspective, layer 170 should be in direct contact with device assembly upper surface 134, and should adhere and thermally couple thereto, minimizing thermal resistance at the interface of surface 134 and layer 170. If layer 170 is formed of multiple sub-layers, each sub-layer interface should exhibit good adherence, to minimize thermal resistance at the interface. From a thermal perspective, the contact area between surface 134 and layer 170 is preferably equal to the area of surface 134, however process considerations may reduce the contact area. Layer 170 should be no thicker than reasonably necessary to insure adequate coverage, since increasing layer 170 thickness lengthens the thermal path from device assembly upper surface 134 to a cooling fluid in contact with an upper surface of layer 170. From a material perspective, layer 170 should exhibit high effective thermal conductivity, and should adhere to device assembly upper surfaces 134.

Layer 170 and its deposition methods should be compatible with layer 160. In particular, layer 170 should adhere to layer 160, as well as to device assembly upper surfaces 134. Layer 170 should also exhibit low residual stress. Finally, the methods used to apply layer 170 should not subject layer 160 to temperatures exceeding the degradation temperature of layer 160: for the layer 160 materials presented herein, layer 170 should be applied at temperatures at or below approximately 200° C. Other layer 160 materials may be substituted by those of skill in the art, some of which may exhibit degradation temperatures above 200° C., thereby allowing higher deposition temperatures for layer 170. Such substitutions are therefore within the spirit and scope of the present invention.

A variety of materials and combinations thereof may be used to simultaneously accomplish the barrier and thermal conduction purposes of layer 170. For example, layer 170 is preferably a multilayer structure having two layers, consisting of an adhesion under-layer, and a primary layer. Optionally, layer 170 may include a third corrosion barrier layer. Such a multilayer structure may be formed, for example, by first depositing a thin under-layer, providing good adhesion to device assembly upper surface(s) 134 and layer 160. The under-layer preferably consists of a layer of chrome (Cr) on the order of 200 Angstroms thick, however thicker under-layers may be used. Preferred embodiments include an under-layer of less than about 1000 Angstroms in thickness. The under-layer is preferably applied using physical vapor deposition. The under-layer may alternatively be applied by sputtering, provided the sputtering temperature remains below layer 160 degradation temperatures (approximately 200° C. or less, for the layer 160 materials presented herein). The primary layer preferably consists of copper (Cu) or an alloy thereof, on the order of 2 to 3 microns thick. This layer is preferably applied by physical vapor deposition (PVD), but may alternatively be applied by, for example, sputtering, ion vapor deposition (IVD), electroplating, or electroless plating, or other suitable methods as known in the art. As with the under-layer, the deposition temperatures should not exceed the layer 160 degradation temperature. The primary layer provides bulk barrier protection, and therefore should be considerably thicker than the adhesion under-layer. In preferred embodiments of the present invention, the primary layer may alternatively be as thin as about 1 micron, or as thick as about 10 microns. Thinner primary layers (less than 1 micron) may not provide sufficient defect coverage, continuity, or mechanical strength, while primary layers thicker than 10 microns increase the thermal conduction path from device upper surface 134 without providing further benefits in defect coverage, continuity, or mechanical strength. Other materials may be used for the primary layer, such as Au, Al, Ni, or alloys thereof, or other suitable materials. Finally, layer 170 may include a third layer, an optional corrosion barrier layer. This layer is preferably composed of Au, Ni, Cr, or Ti, and may be applied by sputtering, PVD, or IVD. Alternatively, electroplating or electroless plating may be used to apply a corrosion barrier layer of Au, Ni, or Cr. As with the under-layer and primary layer, the deposition temperatures should not exceed the layer 160 degradation temperature. A corrosion barrier layer is recommended when the primary layer is composed of Cu or alloys thereof. The corrosion barrier layer is ideally on the order of 600 Angstroms thick, but may be thicker. Preferred embodiments include a corrosion barrier layer of less than about 1000 Angstroms in thickness.

The multilayer passivation structure of the present invention, such as the exemplary embodiment illustrated in FIGS. 1A and 1B, results in minimal mechanical stresses upon connections 136 that might be caused by temperature fluctuations. First passivation layer 160 provides primary mechanical support, allowing use of a thin layer 170. Mechanical stress due to thermal expansion and contraction of layer 160 may be minimized in either of two ways, or a combination of both: by producing layer 160 from a material having a thermal coefficient of expansion (TCE) closely matched to the TCE of substrate 110 and device assemblies 130, or by producing layer 160 from a material capable of absorbing stress. Layer 170, in contrast, is unlikely to be comprised of materials having TCEs matching substrate 110 or device assemblies 130, and is also unlikely to be comprised of materials capable of absorbing stress. By using a thin layer 170, however, the resulting stresses on connections 136 are minimized.

Figure 2A:
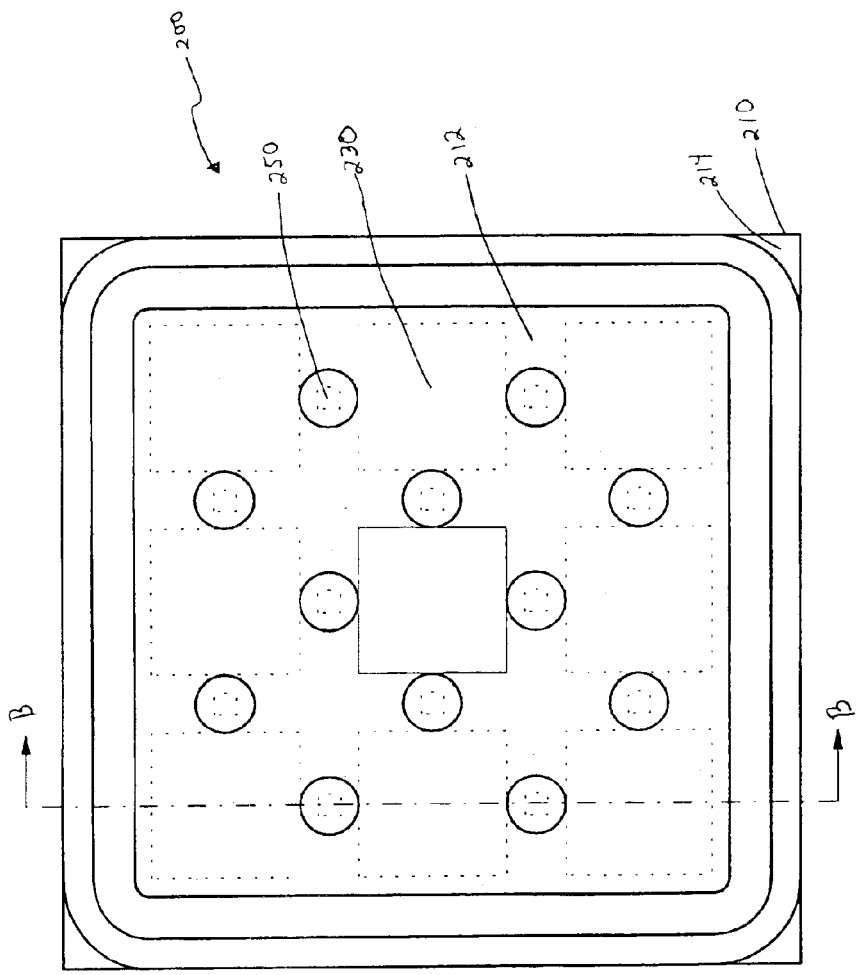
FIG. 2A depicts a top view of a passivated substrate assembly including passive devices, per an embodiment of the present invention.
Figure 2B:
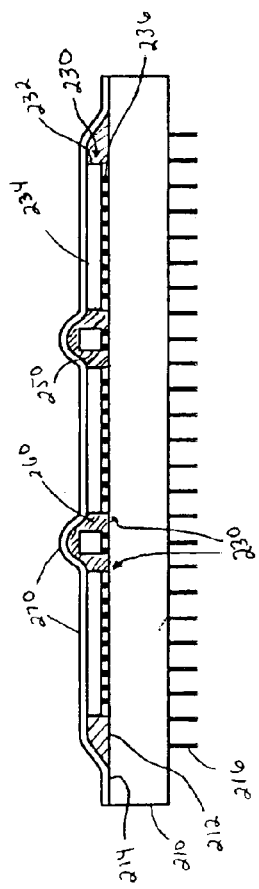
FIG. 2B depicts a cross section of the passivated substrate assembly shown in FIG. 2A, taken along line B—B.

FIGS. 2A and 2B depict an alternative embodiment, substrate assembly 200. As seen in FIGS. 2A and 2B, substrate assembly 200 includes a substrate 210, one or more electronic device assemblies 230, and one or more passive devices 250. Substrate 210 includes upper surface 212, perimeter area 214, and connections 216, analogous to 112, 114, and 116 of substrate 110 depicted in FIG. 1, respectively. Device assemblies 230 include electronic devices 232, connections 236, and upper surface 234, analogous to 132, 136, and 134 of device assemblies 130 depicted in FIG. 1, respectively. Similarly, as seen in FIG. 2B, substrate assembly 200 includes first passivation layer 260 and second passivation layer 270, similar to layers 160 and 170 of assembly 100. As shown in FIG. 2B, passive devices 250 may be taller than one or more of device assemblies 230. If passive devices 250 are taller than one or more of device assemblies 230, layers 260 and 270 vary in height. Passive devices 250 are covered by layer 260, and do not directly contact layer 270. Electronic device assemblies 230, in contrast, are in direct contact with layer 270, and are not covered by layer 260. As illustrated in FIG. 2, layer 260 occupies the volume adjacent to device assemblies 230, but does not occupy the volume between assemblies 230 and substrate upper surface 212. Optionally, as discussed with reference to FIG. 1, layer 260 or a portion thereof may also occupy the volume surrounding connections 236. Various methods may be used to form layer 260 at various heights, preferred embodiments of these methods are described in detail herein, with reference to FIGS. 6 through 10. Once layer 260 is appropriately formed, covering passive devices 250 and exposing device upper surfaces 134, layer 270 may be applied as described with reference to layer 170.

Figures 3A, 3B:
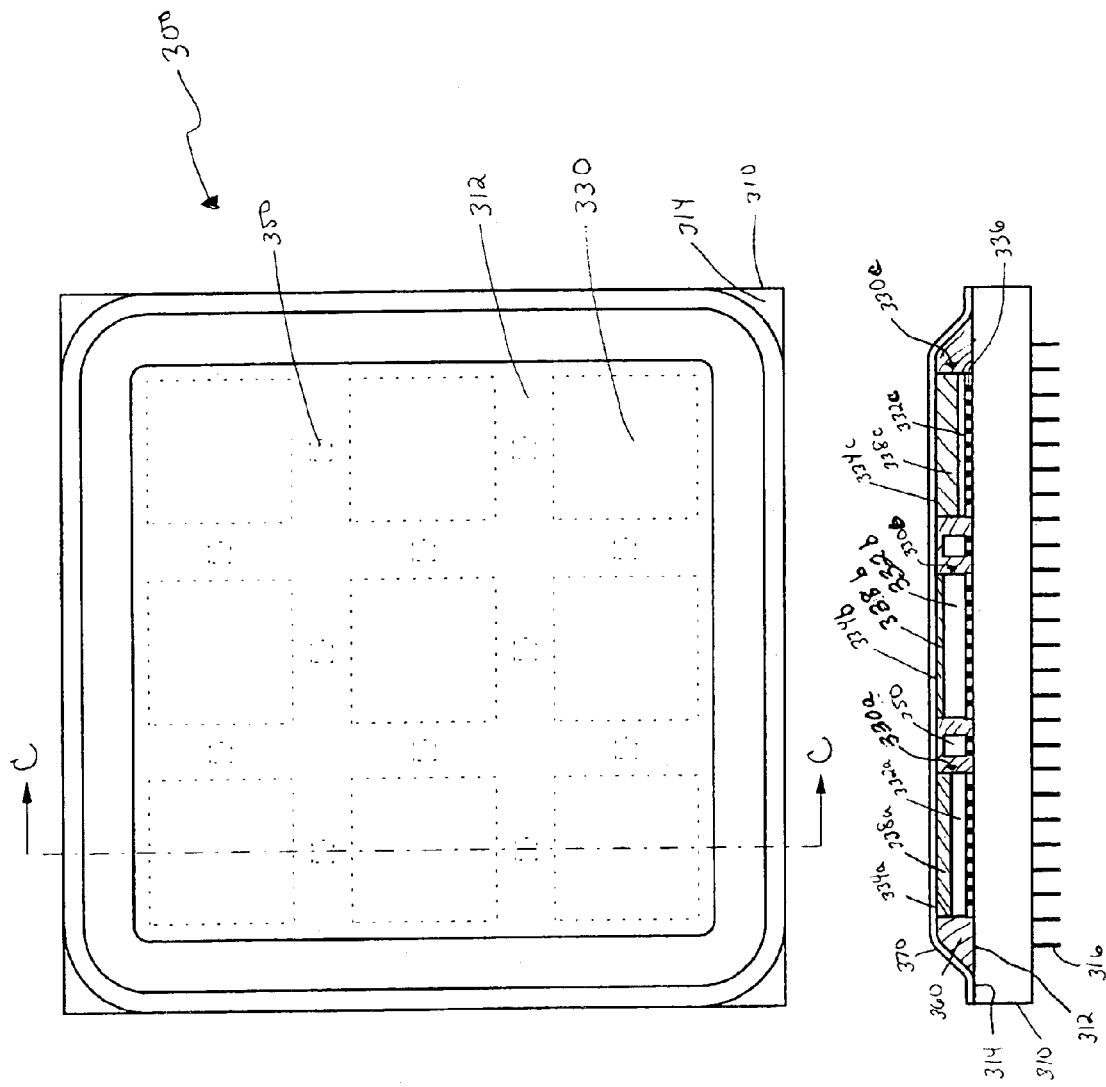
FIG. 3A depicts a top view of a passivated substrate assembly employing spacers bonded to the electronic devices, per an embodiment of the present invention.
FIG. 3B depicts a cross section of the passivated substrate assembly shown in FIG. 3A, taken along line C—C.

FIGS. 3A and 3B depict yet another embodiment of the present invention, substrate assembly 300. As seen in FIGS. 3A and 3B, substrate assembly 300 includes a substrate 310, one or more electronic device assemblies 330, and one or more passive devices 350. Substrate 310 includes upper surface 312, perimeter area 314, and connections 316, analogous to 112, 114, and 116 of substrate 110 depicted in FIG. 1, respectively. Similarly, as seen in FIG. 3B, substrate assembly 300 includes first passivation layer 360 and second passivation layer 370, similar to layers 160 and 170 of assembly 100. Device assemblies 330a, 330b, and 330c (referred to collectively as device assemblies 330), include electronic devices 322a, 332b, and 332c, respectively (referred to collectively as devices 332), with connections 336a, 336b, and 336c, respectively (referred to collectively as connections 336), to substrate upper surface 312. As shown in FIG. 3B, passive devices 350 may be taller than one or more of devices 332. In substrate assembly 300, device assemblies 330 include an additional element, spacers 338a, 338b, and 338c, respectively (referred to collectively as spacers 338), which are in thermal contact with an upper surface of devices 332. Spacers 338 include upper surface 334, forming the uppermost surface of device assemblies 330. The purpose of spacer 338 is to increase the overall height of assembly 330, such that the uppermost surfaces of assemblies 330 (namely, surfaces 334) are higher than passive devices 350. In this way, layer 360 may be formed at a substantially uniform height, eliminating process complexities associated with selectively forming the varied-height layer 260 of assembly 200. In preferred embodiments, spacers 338 are in good thermal contact with an upper surface of devices 332, preferably bonded using solder or a thermal adhesive, such as a thermal epoxy. Spacers 338 should be constructed of a material exhibiting high thermal conductivity; in preferred embodiments, spacers 338 are constructed of a material having a thermal coefficient of expansion (TCE) closely matched to that of devices 332. Spacers 338 are preferably formed of silicon, however materials such as silicon carbide, aluminum nitride, or diamond (natural or man-made), for example, may also be used. Spacers 338 should be as thick as necessary to raise surface 334 sufficiently higher than the uppermost surfaces of passive devices 350, preferably between approximately 5 mils and 10 mils higher. As with layer 170, 270, and 370, spacers 338 should be no thicker than necessary to insure coverage of passive devices 350 by layer 360, to minimize the thermal path between devices 332 and a fluid in contact with an upper surface of layer 370. Minimum spacer heights are determined by factors such as, for example, the material or materials selected for layer 160, process tolerances, etc.

Spacers 338 may alternatively be used to create a substantially uniform height for surfaces 334, in embodiments where devices 332 vary in thickness. As illustrated in FIG. 3B, for example, device assembly 330a includes a device 332a which is thinner than device 332b of assembly 330b, and which is thicker than device 332c of assembly 330c. Each assembly 330a, 330b, and 330c includes an appropriately dimensioned spacer element, 338a, 338b, and 338c, respectively, dimensioned such that upper surfaces 334a, 334b, and 334c are at an approximately uniform height. Thus assembly 330a includes a spacer 338a which is thicker than spacer 338b of assembly 330b, and which is thinner than spacer 338c of assembly 330c. Spacers 338 may thus be advantageously used to create a substantially uniform height for surfaces 334, even in embodiments lacking passive devices 350.

Module Assembly

Figure 4A:
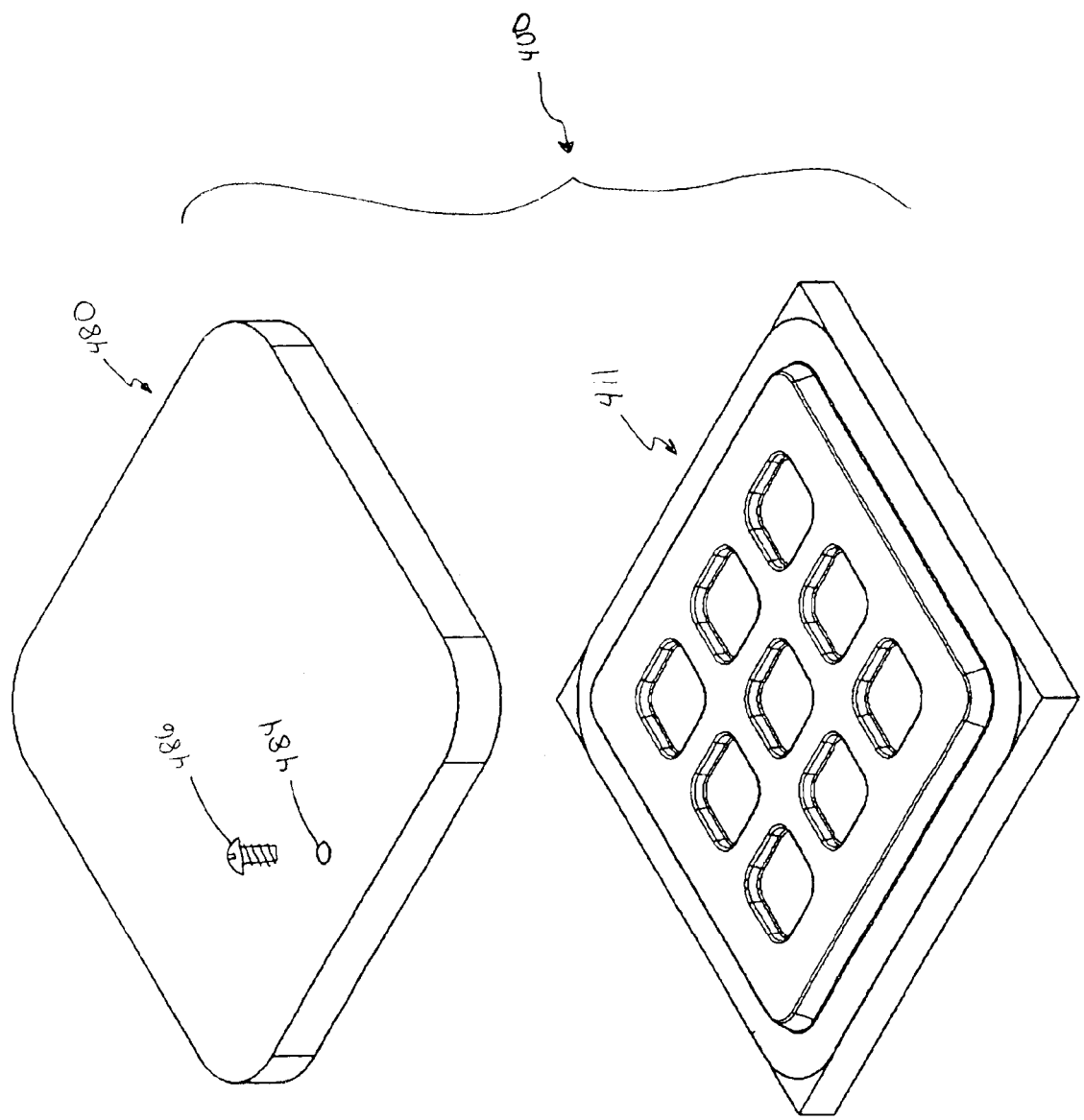
FIG. 4A depicts an exploded isometric view of a electronic module assembly employing a passivated substrate assembly per an embodiment of the present invention.

FIG. 4A illustrates an electronic module assembly 400, employing a passivated substrate assembly, per an embodiment of the present invention. As shown, module assembly 400 includes a passivated substrate assembly 411, module cap 480, and fill plug 486. Sealing device 486 may be any device that is sealable against module cap 480, such as a threaded bolt, valve, etc. Module cap 480 further includes an opening 484 into which plug 486 may be inserted, thereby sealing the assembly. Opening 484 may be used after assembly to introduce a cooling fluid into internal volume 488 (shown in FIG. 4C) of module assembly 400, such as water or other aqueous fluids, while allowing gases to escape. When a suitable quantity of fluid is introduced into volume 488, sealing device 486 is used to seal inlet 484. Cooling fluids such as water or other aqueous fluids, such as brine, are preferred. Dielectric fluids may also be used, however, the superior thermal conductivity and specific heat of aqueous fluids make aqueous cooling fluids a preferred choice. When volume 488 is thus filled with a cooling fluid, the cooling fluid thus transfers heat from the upper surface of second passivation layer 470 (and hence from device assemblies 430) to module cap 480. The primary thermal transfer mechanism in such an embodiment is therefore natural convection. Various methods as known in the art may be used to cool and/or remove heat from module cap 480.

FIGS. 4B, 4C, and 4D illustrate additional aspects of module assembly 400, shown in assembled form. As illustrated in FIG. 4B, the outer edge of module cap 480 is substantially the same shape and size as the outermost edge of substrate 410, and is aligned thereto. As illustrated in FIGS. 4C and 4D, module cap 480 includes a perimeter region 482, which forms a seal above the substrate perimeter region 414. The perimeter seal should be impermeable to water or other aqueous fluids, and is preferably hermetic or nearly hermetic. A completely hermetic seal, while preferable, is not required. Thermal conduction through the perimeter bond is a secondary consideration. In the embodiment illustrated in FIGS. 4C and 4D, second passivation layer 470 extends substantially to the end of substrate perimeter 414: in such an embodiment, cap perimeter region 482 is bonded to second passivation layer 470, using a method such as soldering, brazing, a thermal epoxy, or by mechanical methods such as a gasket or O-ring. If the perimeter seal is formed by a mechanical method, a means of securing cap 480 to substrate 410 is used, such as a series of threaded bolts or other mechanical fasteners as known in the art (not shown). An alternative embodiment is illustrated in FIGS. 5B and 5C: second passivation layer 570 terminates within perimeter area 514, and cap perimeter 582 is bonded to substrate perimeter area 514. In the embodiment of FIGS. 5B and 5C, the perimeter seal can be formed by soldering, brazing, thermal adhesives such as thermal epoxy, or by mechanical methods such as a gasket or O-ring. If the perimeter seal is formed by a gasket, a means of securing cap 580 to substrate 510 is used, such as a series of threaded bolts or other mechanical fasteners as known in the art (not shown).

FIGS. 5A through 5C illustrate another aspect of an embodiment of the present invention, an alternative module cap 580, having fluid inlet and outlet ports 585$a$ and 585$b$, respectively. Ports 585$a$ and 585$b$ are used to provide a flow of cooling fluid through volume 588, thereby increasing the heat removal capability of the assembly. Port 585$a$ serves as an inlet, and port 585$b$ serves as an outlet, both connecting to an external heat exchanger system (not shown), thereby creating a closed loop fluid flow path. The assignment of port 585$a$ as inlet and port 585$b$ as outlet is clearly interchangeable. In such an embodiment, a cooling fluid removes heat from second passivation layer 570 by forced convection. The temperature of the cooling fluid leaving volume 588 is thus increased in relation to the temperature of cooling fluid entering volume 588. The higher temperature cooling fluid passes through a heat exchanger (not shown) prior to returning to inlet port 585$a$ for reintroduction into volume 588. Alternative embodiments are envisioned, using: more than two ports, or a plenum arrangement to distribute fluid within volume 588, or using a baffle arrangement within volume 588 to control and direct fluid flow within volume 588. Each of these alternatives may be used alone, or in conjunction with any other combination of alternatives.

In some applications, it may be advantageous to partially fill volume 488 (or 588) with cooling fluid, at subatmospheric pressure. In such an application, an alternative filling device and method are employed, such as a filling valve. FIGS. 11A through 11C illustrate filling valve 1100, which may be used to fill volume 488 or 588 with cooling fluid at subatmospheric pressure.

With reference now to FIGS. 11A through 11C, the operation of filling valve 1100 is now described with specific reference to module assembly 400. Valve 1100 may also be advantageously used with other embodiments, such as module assembly 500. As shown in FIG. 11A, filling valve 1100 includes valve body 1102, spring 1104, module port 1106, external port 1108, valve seat 1110, and threaded casing 1107. Threaded casing 1107 is a slightly modified version of fill port 484, adapted for valve 1100. FIG. 11A depicts valve 1100 after final assembly of module 400. In this state, spring 1104 presses valve seat 1110 against the angled sides of valve body 1102, thereby sealing off external port 1108. FIG. 11B depicts valve 1100 during the process of evacuating air from and introducing fluid into module 400. Filling device 1109 includes a threaded portion, engageable with threaded casing 1107. Device 1109 further includes seal 1103$a$, such as a gasket or O-ring. During the evacuation and fill process, device 1109 is threaded into casing 1107, engaging seal 1103$a$ against module cap 480, thereby creating an air and liquid tight seal. Device 1109 includes projection 1101, which depresses valve seat 1110, thereby opening external port 1108. Device 1109 should be designed such that seal 1103$a$ sealably engages module cap 480 before projection 1101 begins to depress valve seat 1110. In the position shown in FIG. 11B, a vacuum is applied to device 1109, evacuating air from within module 400. While maintaining vacuum, cooling fluid is introduced into module 400, preferably at a pressure below atmospheric pressure. Once the desired pressure of cooling fluid is introduced, device 1109 is removed from valve 1100, returning valve 1100 to the state illustrated in FIG. 11A. During device 1109 removal, seal 1103$a$ should remain sealably engaged against module cap 480 until valve seat 1110 seals external port 1108. Finally, plug 1105 is inserted into threaded casing 1107. Plug 1105 includes seal 1103$b$, which sealably engages module cap 480, thereby preventing ingress of ambient air into module 400. Plug 1105 and seal 1103$b$ provide a higher quality and more permanent seal than the temporary seal provided by valve seat 1110.

Another embodiment of the present invention which may be advantageously employed to remove heat from a fluid within a module having one or more fluid inlets and one or more fluid outlets, such as module 500, involves partially filling volume 588 with a cooling fluid, preferably at subatmospheric pressure, allowing the fluid to boil or evaporate, and providing an external condenser connected to ports 585$a$ and 585$b$, whereby cooling fluid exits volume 588 in vapor phase, and returns to volume 588 in liquid phase. One such device, using a plurality of inlet and outlet ports, is described in commonly owned U.S. patent application Ser. No. 10/040680, having a filing date of Nov. 9, 2001, and which has been incorporated herein by reference in its entirety.

Methods of Making

While, at a detailed level, a number of process embodiments are possible, a basic method of making a passivated substrate assembly of the present invention can be described which encompasses all such embodiments. The essential steps involved are 1) applying a first passivation layer around electronic device assemblies to be cooled, and over passive devices (if present), 2) exposing an upper surface of each electronic device assembly, and 3) depositing a thermally conductive, impermeable barrier material over the first passivation layer and the device assembly upper surfaces, causing the thermally conductive barrier material to thermally couple to device assembly upper surfaces and the substrate perimeter. Of these three essential steps, steps 2 and 3 exhibit the greatest variability.

A variety of process embodiments may be used to apply the first passivation layer, and to expose the device assembly upper surfaces, in keeping with the spirit and scope of the present invention. Three exemplary embodiments are described in detail herein; a summary of these exemplary embodiments is now provided. Other process embodiments are envisioned, within the spirit and scope of the present invention, and are considered part of the invention. One exemplary embodiment involves the application of a uniform or conformal first passivation layer over a substrate subassembly, followed by selective removal of portions of the first passivation layer, thereby exposing device assembly upper surfaces. A second exemplary embodiment involves a selective application of a first passivation layer around the device assemblies and covering passive devices, while leaving device assemblies exposed. An optional uniform exposure step follows, to insure full exposure of device assembly upper surfaces. Finally, a third exemplary embodiment involves a uniform application of a first passivation layer, followed by a uniform removal. This third embodiment may be used when device assembly upper surfaces are the highest on the substrate subassembly, such as when the substrate subassembly does not include passive devices, or includes passive devices which are shorter than the device assemblies, or when one or more spacers are included within device assemblies in order to insure that device assembly upper surfaces are higher than passive devices.

FIGS. 6A through 6F illustrate aspects of a selective etch process embodiment, in which a uniform or conformal first passivation layer is applied over a substrate subassembly, followed by selective removal of portions of the first layer, thereby exposing device assembly upper surfaces. In this embodiment, the first passivation layer is composed of two separate layers, a sub-layer and a top layer.

Figure 6A:
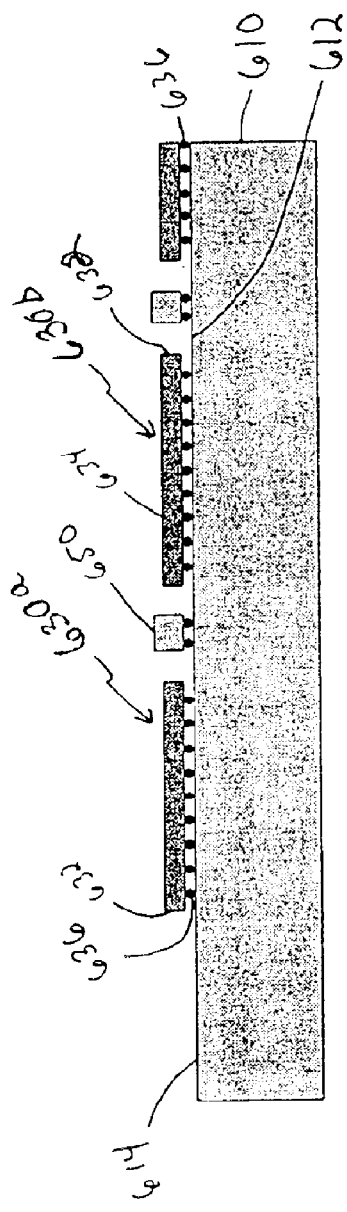
FIGS. 6A through 6F depict the initial, intermediate, and final structures produced during a selective etch production process, per an embodiment of the present invention.

FIG. 6A illustrates a substrate assembly prior to passivation. Optionally, prior to the application of a first passivation layer, a preliminary step may be desirable, to clean and prepare the substrate subassembly surfaces. For example, as illustrated in FIG. 6A, a substrate subassembly may initially include substrate 610 having an upper surface 612, device assemblies 630 connected to substrate upper surface 612, and one or more passive devices 650 connected to substrate upper surface 612. A substrate subassembly preparation step should be performed on the structure illustrated in FIG. 6A, such as a cleaning step using, for example, a nonpolar solvent such as xylene, followed by a polar solvent such as isopropyl alcohol (IPA), followed by a surface ash step, such as an $O_2$/Ar or water down stream plasma ash, preferably for a duration of approximately 5 minutes.

Figure 6B:
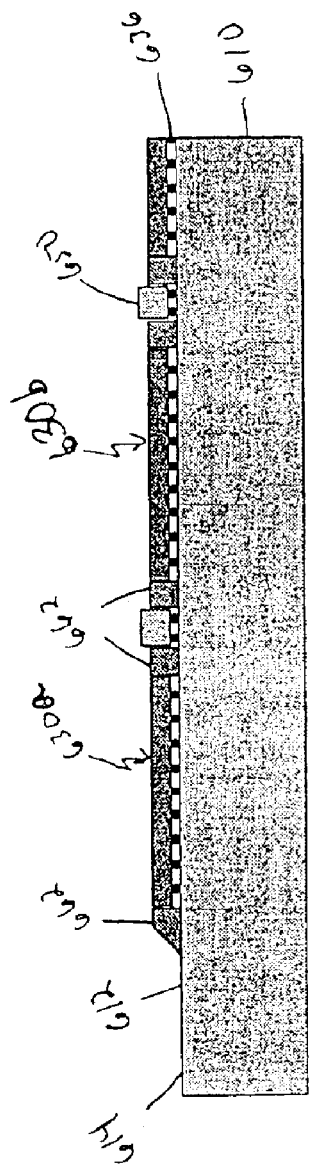

FIG. 6B illustrates an intermediate structure, including a first passivation sub-layer 662. First passivation sub-layer 662 is placed around each device assembly 630, substantially filling the volume between each device 630 and the nearest passive device 650. In embodiments without passive devices, such as the embodiment illustrated in FIG. 1, first passivation sub-layer 662 substantially fills the volume between adjacent devices, such as devices 130 of FIG. 1. Around the outermost device assemblies, such as 630a, first passivation sub-layer 662 is beveled in order to create a smooth transition between device assembly upper surface 634 and substrate upper surface 612. The primary purpose of first passivation sub-layer 662 is to provide mechanical support for a thin top layer, described herein with reference to FIG. 6C. First passivation sub-layer 662 should impose minimal mechanical stress on device assemblies 630, as a result of thermal expansion and contraction. Mechanical stress due to thermal expansion and contraction may be minimized in either of two ways: by producing sub-layer 662 from a material having a TCE closely matched to the TCE of substrate 610 and device assemblies 630, or by producing sub-layer 662 from a material capable of absorbing stress, such as an elastomer. Sub-layer 662 may be formed of materials such as, for example, engineering glass or silicon, thereby closely matching the TCE of device assemblies 630 and substrate 610. If sub-layer 662 is formed of a stress-absorbing material, such as an elastomer, a variety of material properties are desirable. For example, an elastomer used to form sub-layer 662 should exhibit a glass transition temperature (Tg) of less than 0° C. The elastomer should exhibit a high elongation at break, preferably at least 40%. To insure that the elastomer is not degraded by subsequent processing, the elastomer should be stable when exposed to temperatures of up to 240° C. for a brief duration. Finally, the elastomer should exhibit low diluent outgassing. Suitable elastomeric materials for sub-layer 662 are, for example: silicones (such as a silicone sold under the trademark SYLGARD® 577), acrylic elastomers, thermoplastic elastomers, thermoplastic copolymers, polysulfide polymers, and polyurethanes. First sub-layer 662 is preferably preformed, as a single unit or a plurality of component pieces, and applied to substrate 610 in solid form. First sub-layer 662 is preferably bonded to substrate 610 upper surface 612, such as by using an epoxy or other suitable bonding agent. After first sub-layer 662 is applied, substrate assembly 610 may be baked to cure the bonding agent, such as epoxy.

Optionally, prior to depositing first sub-layer 662, an underfill or encapsulant may be applied around connections 636. As previously discussed, materials such as epoxy or a thermoplastic resin (such as polysulfone or polyetherimide) or other suitable materials may be used to encapsulate connections 636.

Once sub-layer 662 is in place, a surface preparation step should be performed. A surface preparation step should be performed on the structure illustrated in FIG. 6B, such as a cleaning step using, for example, a nonpolar solvent such as xylene, followed by a polar solvent such as isopropyl alcohol (IPA), followed by a surface ash step, such as an $O_2$/Ar or water down stream plasma ash, preferably for a duration of approximately 5 minutes. After cleaning, an adhesion layer may be applied to the substrate assembly illustrated in FIG. 6B, to promote adhesion of the first passivation top layer. For example, a solution of approximately 0.5%–1.0% v/v silane coupling agents, such as 3-aminopropyltriethoxy silane (3-APS), may be spread over the surface of the intermediate substrate assembly structure illustrated in FIG. 6B, then baked in vacuum, preferably at approximately 95° C. for approximately 3 minutes.

Figure 6C:
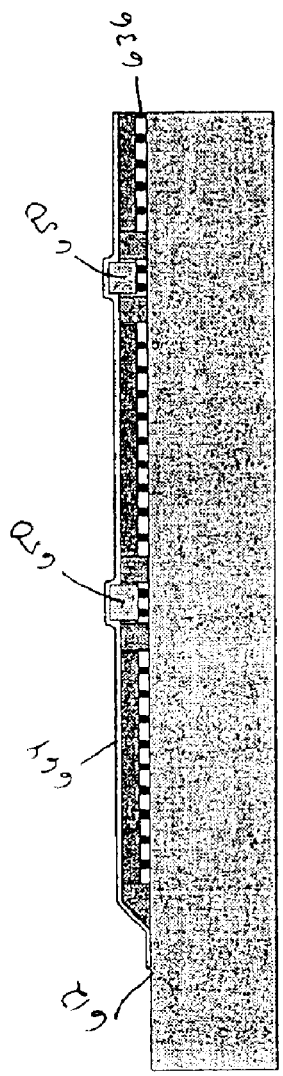

FIG. 6C illustrates a subsequent intermediate structure, including a first passivation top-layer 664. First passivation top-layer 664 is a conformal coating of a polymer material. In preferred embodiments of the present invention, the material used to form first passivation top-layer 664 exhibits a number of desirable properties. The material should provide a conformal coating over sub-layer 662 and device assembly upper surfaces 634, and should adhere to both sub-layer 662 and device assembly upper surfaces 634. The material should exhibit a relatively high elongation at break, preferably at least 10%. The material should exhibit a glass transition temperature (Tg) below the solvent boiling point, in order to form a film having low defect density and good adhesion. Finally, to insure that the material is not degraded by subsequent processing, the material should be stable when exposed to temperatures of up to 240° C. for a brief duration. Suitable polymer materials for top-layer 664 include: thermoplastic polyimides (such as a polyimide syloxane sold under the trademark SILTEM® STM 1500), photosensitive polyimides, and polyethersulfone. First passivation top-layer 664 provides the mechanical support for second passivation layer 670, and isolates passive devices 650 from second passivation layer 670. First passivation top-layer 664 is preferably on the order of 2–3 microns thick.

Figure 6D:
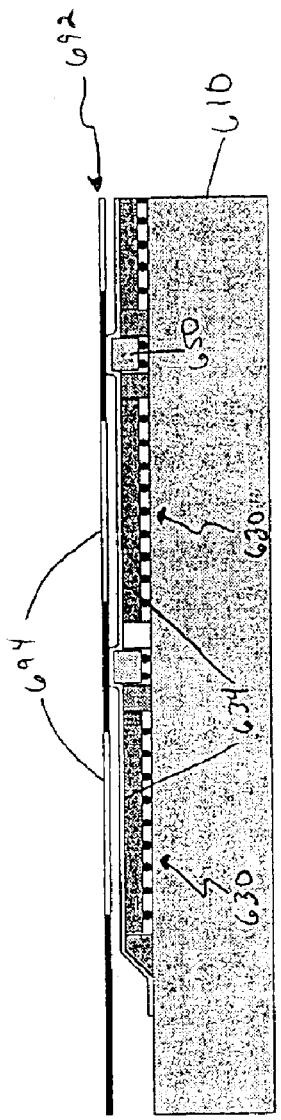
Figure 6E:
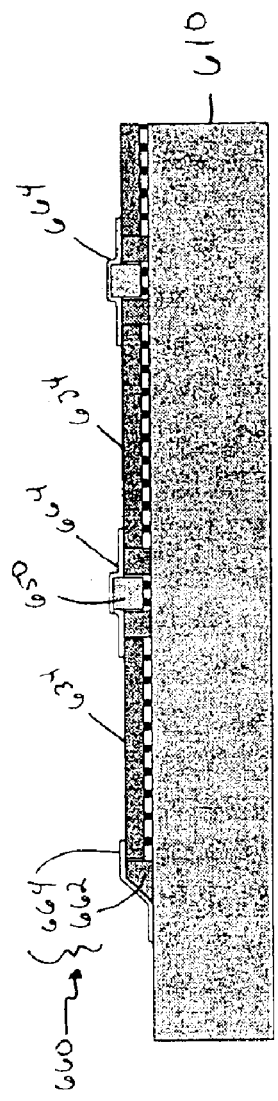

FIG. 6D illustrates selective removal of first passivation top-layer 664 over device assemblies 630. As shown in FIG. 6D metal mask 692 is placed over the substrate assembly with applied and cured first passivation top-layer 664. Metal mask 692 includes an opening 694 corresponding to each device assembly 630; each mask opening 694 is slightly smaller than its corresponding device assembly upper surface 634. As shown in FIG. 6E, this results in a final first passivation top-layer 664 which covers passive devices 650, first passivation sub-layer 662, and which further covers the perimeter of device assembly upper surfaces 634. With mask 692 in place, an $O_2/CF_4$ reactive ion etch (RIE) is performed to remove material from device assembly upper surfaces 634. The RIE process may be used to control the sidewalls formed in the portion of first passivation top-layer 664 remaining on the perimeter of device upper surfaces 634.

FIG. 6E illustrates an intermediate structure, after removal of portions of top-layer 664 above device assemblies 630, thereby exposing the central portions of surfaces 634. Next, a surface preparation step should be performed on the structure illustrated in FIG. 6E, such as a cleaning step using, for example, a nonpolar solvent such as xylene, followed by a polar solvent such as isopropyl alcohol (IPA), followed by a vacuum bake at approximately 100° C. for a duration of approximately one to four hours, followed by a surface ash step, such as an $O_2/Ar$ or water down stream plasma ash, preferably for a duration of approximately 5 minutes.

Figure 6F:
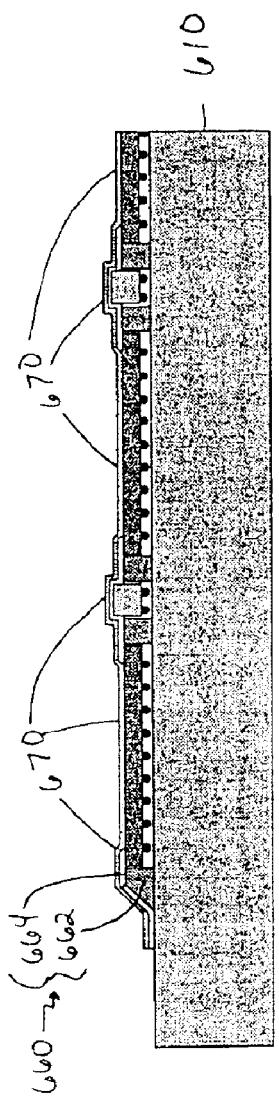

FIG. 6F illustrates a final passivated substrate assembly, per an embodiment of the present invention, including second passivation layer 670. In the embodiment of FIG. 6, first passivation layer 660 is comprised of two portions or sub-layers: layer 662 and layer 664. Second passivation layer 670 is similar to layer 170, described herein in detail with reference to FIGS. 1A and 1B. Second passivation layers 670 and 170 may, in general, differ in topology due to differences in the underlying topology created by first passivation layers 660 and 160, respectively. Otherwise, second passivation layers 670 and 170 are identical: the purposes, materials, and fabrication methods of layer 170 also apply to layer 670.

Alternatively, a photolighographic process embodiment may be used to accomplish the process steps discussed above, with reference to FIGS. 6C through 6E. In this embodiment, first passivation top-layer 664 is a photosensitive material, preferably a positive resist-type photosensitive polyimide such as, for example, a photosensitive polyimide sold under the trademark PROBIMIDE®. Specific details of photosensitive polyimide processing, such as pre-exposure bake, and post exposure develop and cure, may be found in Tummala, R. R. et. al, *Microelectronics Packaging Handbook, Semiconductor Packaging, Part II*, (Second Edition, Kluwer Accademic Publisher, 1999), pp 583–587, which is hereby incorporated herein by reference. A mask is used to block areas over device assemblies 630 during a subsequent 365 nm exposure step, thereby exposing and crosslinking regions of first passivation top-layer 664 which are to remain as part of the final substrate assembly, as illustrated in FIG. 6E. Subsequent to the exposure step, the photosensitive polyimide is developed and cured. ® Next, a surface preparation step should be performed, such as a cleaning step using, for example, a nonpolar solvent such as xylene, followed by a polar solvent such as isopropyl alcohol (IPA), followed by a vacuum bake at approximately 100° C. for a duration of approximately one to four hours, followed by a surface ash step, such as an $O_2/Ar$ or water down stream plasma ash, preferably for a duration of approximately 5 minutes. Finally, second passivation layer 670 may be applied, as previously described.

FIGS. 7A through 7D illustrate aspects of a selective application or molding process embodiment of the present invention, in which a first passivation layer is selectively applied around device assemblies and over passive devices while leaving device assemblies exposed, followed by an optional uniform exposure step to insure complete exposure of device assembly upper surfaces. In the embodiment of FIG. 7, a single layer is used to form a first passivation layer.

Figure 7A:
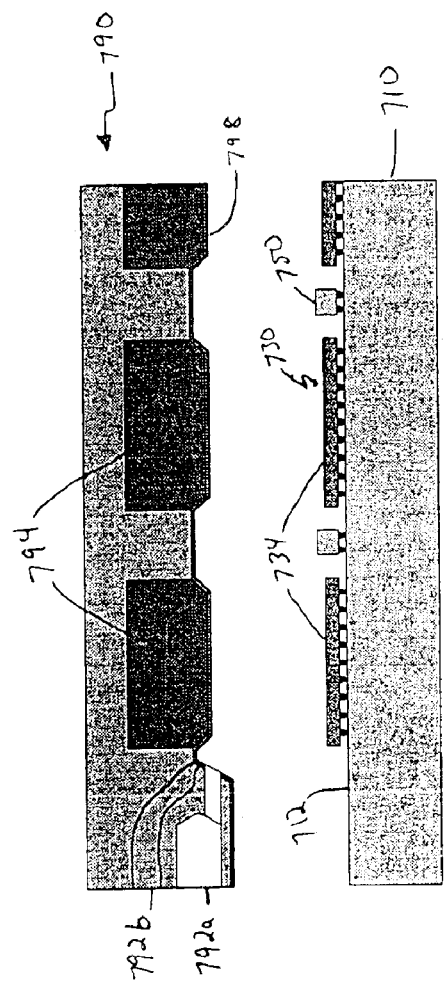
FIGS. 7A through 7D depict the initial, intermediate, and final structures produced during a production process employing a mold operation, per an embodiment of the present invention.

FIG. 7A illustrates a substrate assembly prior to passivation. Optionally, prior to the application of a first passivation layer, a preliminary step may be desirable, to clean and prepare the substrate subassembly surfaces. For example, as illustrated in FIG. 7A, a substrate subassembly may initially include substrate 710 having an upper surface 712, device assemblies 730 connected to substrate upper surface 712, and one or more passive devices 750 connected to substrate upper surface 712. An initial surface preparation step should be performed on the structure illustrated in FIG. 7A, such as a cleaning step using, for example, a nonpolar solvent such as xylene, followed by a polar solvent such as isopropyl alcohol (IPA), followed by a surface ash step, such as an $O_2/Ar$ or water down stream plasma ash, preferably for a duration of approximately 5 minutes. Next, an adhesion layer may be applied to the substrate assembly illustrated in FIG. 7A, to promote adhesion of the first passivation layer. For example, a solution of approximately 0.5%–1.0% v/v silane coupling agents, such as 3-aminopropyltriethoxy silane (3-APS), may be spread over the surface of the substrate assembly structure illustrated in FIG. 7A, then baked in vacuum, preferably at approximately 95° C. for approximately 3 minutes.

FIG. 7A further illustrates mold 790 of one embodiment of the present invention. Mold 790 is used to form a first passivation layer that completely covers passive devices such as devices 750, while preventing formation of a first passivation layer above device assemblies 730. As illustrated in FIG. 7A, a preferred embodiment of mold 790 includes at least one fill port 792a and at least one vent port 792b, a flexible insert 794 corresponding to each device assembly 730 to be cooled, and preferably includes a surface coating or release agent 798, such as polytetrafluoroethylene (PTFE), for example PTFE sold under the trademark TEFLON®. In preferred embodiments, mold 790 is composed of a rigid, thermally conductive material, such as aluminum or copper, or alloys thereof. Inserts 794 are composed of a flexible material such as a flourinated elastomer, for example, such as a copolymer of vinylidene fluoride and hexafluoropropylene, for example an elastomer sold under the trademark VITON®.

Figure 7B:
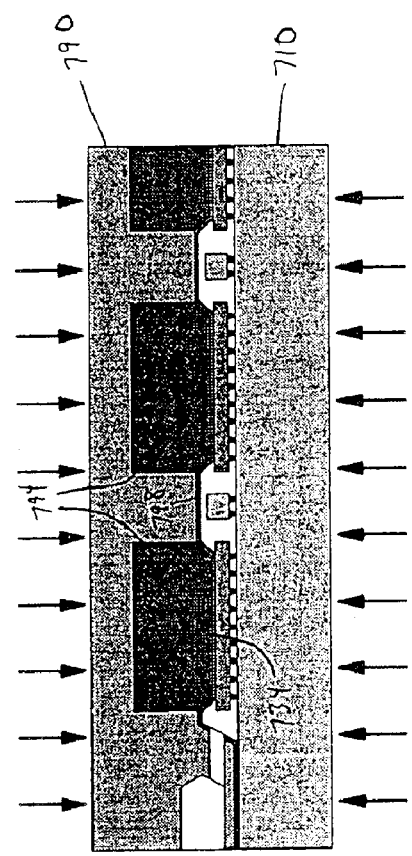

Formation of a first passivation layer begins by aligning and mating mold 790 with substrate assembly 710, as illustrated in FIG. 7B. Alignment of mold 790 to substrate assembly 710 may be accomplished by aligning the edges of mold 790 to the edges of substrate 710. In embodiments where rotational alignment is required, a single corner of substrate 710 may be chamfered, and a protrusion included on the corresponding corner of mold 790. Alternative alignment methods may be used, as known in the art. Once mold 790 and substrate 710 are properly aligned, they are brought into contact and compressed. Flexible inserts 794 now contact device upper surfaces 734, compressing inserts 794. Inserts 794 conform to surfaces 734, thereby preventing formation of a first passivation layer on surfaces 734.

Once mold 790 and substrate 710 are aligned and mated, a first passivation layer is formed. First, heat is applied to both mold 790 and substrate 710, to aid in the dispersion of passivation material. Next, passivation material is injected through fill port 792a, using a transfer mold technique. In order to minimize mechanical stresses due to TCE mismatches, layer 760 is formed of a stress-absorbing material, such as an elastomer. A variety of material properties are desirable for the layer 760 material. For example, an elastomer used to form layer 760 should exhibit a glass transition temperature (Tg) of less than 0° C. The elastomer should exhibit a high elongation at break, preferably at least 40%. To insure that the elastomer is not degraded by subsequent processing, the elastomer should be stable when exposed to temperatures of up to 240° C. for a brief duration. Finally, the elastomer should exhibit low diluent outgassing. Suitable elastomeric materials for layer 760 are, for example: silicones, acrylic elastomers, thermoplastic elastomers, thermoplastic copolymers, polysulfide polymers, and polyurethanes (such as, for example, a polyurethane elastomer sold under the trademark BAYFLEX® 180). After the passivation material is injected through fill port 792$a$, the passivation material is cured and hardened prior to removal of mold 790.

Figure 7C:
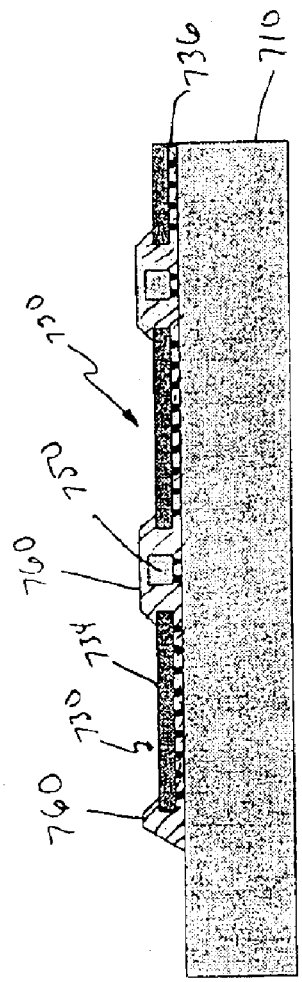

As depicted in FIG. 7C, after first passivation layer 760 has cured and hardened, mask 790 is removed. As previously noted, in preferred embodiments mold 790 includes a surface coating or release agent 798, such as PTFE, thereby preventing adhesion of mold 790 to either first passivation layer 760, or device upper surfaces 734. FIG. 7C illustrates the intermediate structure after removal of mold 790: first passivation layer 760 now substantially occupies the volume around device assemblies 730, and covers passive devices 750, while device assembly upper surfaces 734 remain substantially exposed. Furthermore, as a result of the injection mold process, first passivation layer 760 also substantially occupies the volume surrounding connections 736.

After removal of mask 790 and prior to application of second passivation layer 770, a uniform material removal step is optionally performed, to insure that device assembly upper surfaces 734 are free of debris resulting from the application of first passivation layer 760. The removal step should be optimized to remove a light organic coating (for example, 2000 Angstroms or less) from surfaces 734, while leaving a sufficient thickness of layer 760 over passive devices 750. Such a removal step may be performed by, for example, an $O_2$/Ar downstream plasma ash, preferably at an etch rate on the order of 200 Angstroms per minute, for approximately 10 minutes.

Subsequently, an optional surface preparation or step should be performed on the structure illustrated in FIG. 7C, such as a cleaning step using, for example, a nonpolar solvent such as xylene, followed by a polar solvent such as isopropyl alcohol (IPA), followed by a surface ash step, such as an $O_2$/Ar or water down stream plasma ash, preferably for a duration of approximately 5 minutes.

Figure 7D:
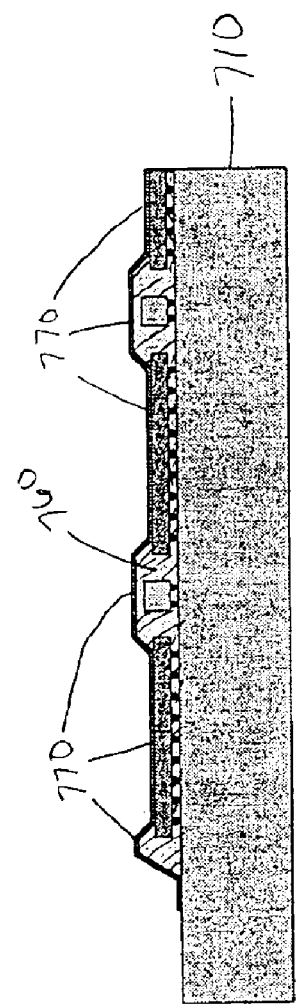

FIG. 7D illustrates a final passivated substrate assembly, per an embodiment of the present invention, including second passivation layer 770. Second passivation layer 770 is similar to layer 170, described herein in detail with reference to FIGS. 1A and 1B. Second passivation layers 770 and 170 may, in general, differ in topology due to differences in the underlying topology created by first passivation layers 760 and 160, respectively. Otherwise, second passivation layers 770 and 170 are identical: the purposes, materials, and fabrication methods of layer 170 also apply to layer 770.

Figure 8:
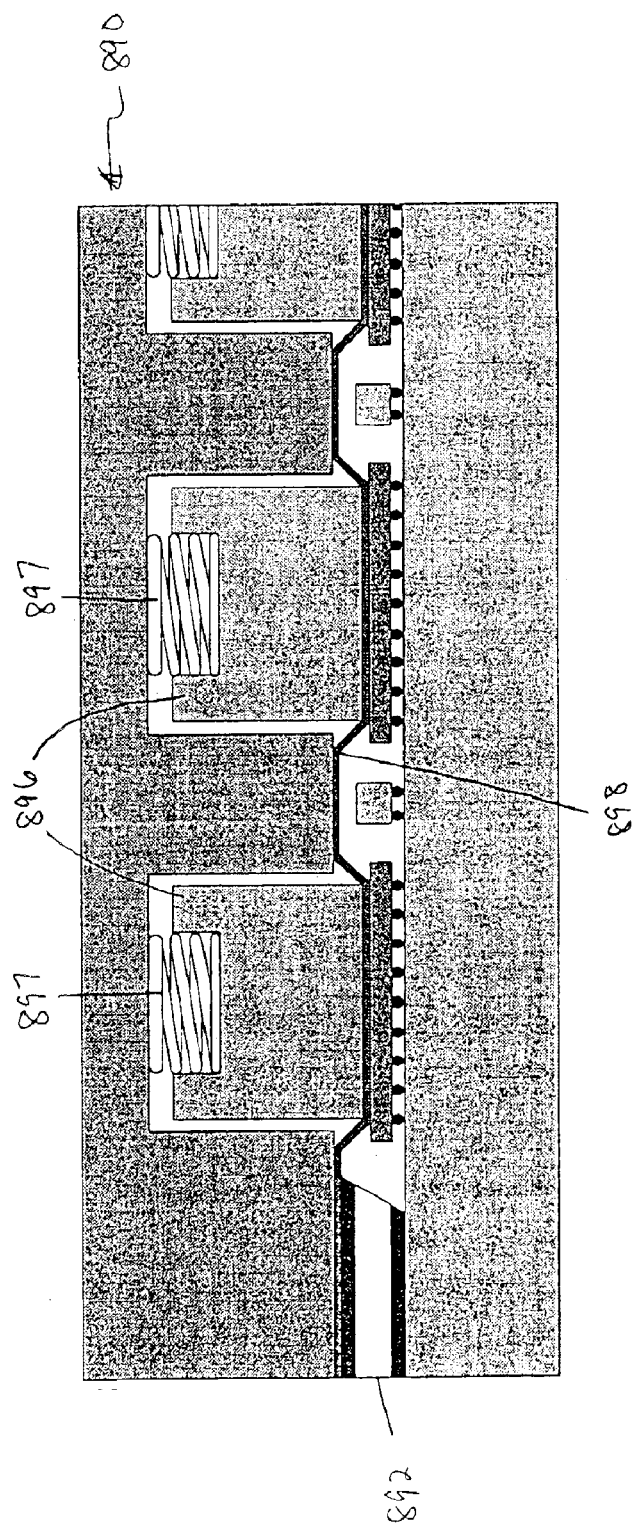
FIG. 8 depicts an alternative mold structure, per an embodiment of the present invention.

Alternative embodiments of mold 790 are within the spirit and scope of the present invention; one such alternative mold embodiment is depicted in FIG. 8. As shown in FIG. 8, mold 890 substitutes pistons 896 for flexible inserts 794 of mold 790. In order to achieve similar compressive force on surfaces 834, springs 897 are inserted between the piston base and the body of mold 890. Pistons 896 are preferably cylindcrical, however pistons 896 may have other shapes, within the spirit and scope of the present invention. A preformed metal foil 898 is placed beneath the mold body and pistons 896, creating the surface which will contact device upper surfaces 834, and which will also provide the form for the first passivation layer material. Foil 898 is preferably aluminum or alloys thereof, however other metals such as copper or alloys thereof may be used. In preferred embodiments, foil 898 includes a release agent, such as for example a PTFE coating (such as PTFE sold under the trademark TEFLON®, for example), to prohibit adhesion between foil 898 and first passivation layer material. As in mold 790, the purpose of pistons 896 is to prevent formation of a first passivation layer on the regions of device assembly upper surfaces 834 which are in contact with pistons 896.

FIGS. 9A through 9E illustrate aspects of a spacer process of an embodiment of the present invention, in which a uniform application of a first passivation layer is performed, followed by a uniform removal, thereby creating a structure similar to the embodiment illustrated in FIG. 3B. This process embodiment may be used when device assembly upper surfaces are the highest on the substrate subassembly, such as when the substrate subassembly does not include passive devices, or includes passive devices which are shorter than the device assemblies, or when one or more spacers are included within device assemblies in order to insure that device assembly upper surfaces are higher than passive devices. While FIGS. 9A through 9E illustrate the process with an assembly using spacers, aspects of the process embodiment illustrated are equally applicable in embodiments where the substrate subassembly does not include passive devices, or includes passive devices which are shorter than the device assemblies, where spacers may therefore not be required.

FIG. 9A illustrates a substrate assembly prior to passivation. Optionally, prior to the application of a first passivation layer, a preliminary step may be desirable, to clean and prepare the substrate subassembly surfaces. For example, as illustrated in FIG. 9A, a substrate subassembly may initially include substrate 310 having an upper surface 312, electronic devices 332 connected to substrate upper surface 312, and one or more passive devices 350 connected to substrate upper surface 312. An optional surface preparation step should be performed on the structure illustrated in FIG. 9A, such as a cleaning step using, for example, a nonpolar solvent such as xylene, followed by a polar solvent such as isopropyl alcohol (IPA), followed by a surface ash step, such as an $O_2$/Ar or water down stream plasma ash, preferably for a duration of approximately 5 minutes.

As illustrated in FIG. 9B, spacers 338 are attached to the uppermost surfaces of electronic devices 332. Each electronic device assembly 330 now includes an electronics device 332, and a spacer 338 with an upper surface 334. As previously discussed with reference to FIG. 3, spacers 338 cause the height of device assembly 330 upper surface 334 to exceed the height of passive devices 350. Furthermore, as illustrated in FIG. 3B, in embodiments having electronic devices 332 of various thicknesses, spacers 338 may also vary in thickness in order to create a set of upper surfaces 334 at a substantially uniform height. Spacers 338 are bonded to devices 332 by soldering, thermal epoxy, or other means of creating a permanent, thermally conductive bond. Spacers 338 are composed of a material having good thermal conductivity, and preferably having a coefficient of thermal expansion closely matching that of device 332. Spacers 338 are preferably formed of silicon, however other materials such as silicon carbide, aluminum nitride, or diamond (natural or man-made), or other suitable materials, may be used.

After bonding spacers 338 to devices 332, an optional surface preparation step should be performed, on the structure illustrated in FIG. 9B, such as a cleaning step using, for example, a nonpolar solvent such as xylene, followed by a polar solvent such as isopropyl alcohol (IPA), followed by a surface ash step, such as an $O_2$/Ar or water down stream plasma ash, preferably for a duration of approximately 5 minutes. Next, an adhesion layer may be applied to the substrate assembly illustrated in FIG. 9B, to promote adhesion of the first passivation layer. For example, a solution of approximately 0.5%–1.0% v/v silane coupling agents, such as 3-aminopropyltriethoxy silane (3-APS), may be spread over the surface of the substrate assembly structure illustrated in FIG. 7A, then baked in vacuum, preferably at approximately 95° C. for approximately 3 minutes.

FIG. 9C illustrates an intermediate structure, after application of first passivation layer 360. In the process embodiment of FIGS. 9A through 9E, first passivation layer material is uniformly applied over the substrate assembly, covering substrate upper surface 312 (possibly excluding at least a portion of perimeter area 314), device assemblies 330, and passive devices 350. In order to minimize mechanical stresses due to TCE mismatches, layer 360 is formed of a stress-absorbing material, such as an elastomer. A variety of material properties are desirable for the layer 360 material. For example, an elastomer used to form layer 360 should exhibit a glass transition temperature (Tg) of less than 0° C. The elastomer should exhibit a high elongation at break, preferably at least 40%. To insure that the elastomer is not degraded by subsequent processing, the elastomer should be stable when exposed to temperatures of up to 240° C. for a brief duration. Finally, the elastomer should exhibit low diluent outgassing. Suitable elastomeric materials for layer 360 are, for example: silicones (such as a silicone sold under the trademark SYLGARD® 577), acrylic elastomers, thermoplastic elastomers, thermoplastic copolymers, polysulfide polymers, and polyurethanes. Other materials having the properties described herein may be substituted by one of skill in the art, and are therefore within the spirit and scope of the present invention. As shown in FIG. 9C, first passivation layer 360 is beveled around the outermost device assemblies, in order to create a smooth transition between device assembly upper surfaces 334 and substrate upper surface 312. First passivation layer 360 is applied in liquid form, using a perimeter frame such as frame 99 illustrated in FIG. 10. As illustrated in FIG. 9C, layer 360 is applied such that it completely covers passive devices 350, and assemblies 330.

Prior to depositing a second passivation layer, first passivation layer 360 is uniformly etched or polished back, until surfaces 334 are exposed. Processes such as mechanical polishing, or chemical and mechanical (chem/mech) polishing or etching may be used to uniformly polish back the upper surface of first passivation layer 360. As previously noted, spacers 338 are added to device assemblies 330 in order to insure that upper surfaces 334 are higher than the uppermost surfaces of passive devices 350. Thus, when first passivation layer 360 is uniformly etched or polished, surfaces 334 will be exposed while passive devices 350 remain covered. First passivation layer 360 is etched until all surfaces 334 are exposed. As previously discussed with reference to FIG. 3B, in applications having devices 332 of varying thicknesses, spacers of varying thicknesses may be used such that surfaces 334 are at a substantially uniform height. In this manner, surfaces 334 are exposed at substantially the same etch depth. Various methods as known in the art may be used to determine the etch end point, such as visual inspections, etch stops composed of relatively hard materials (such as, for example, tungsten), or other end point detection methods.

FIG. 9D illustrates an intermediate structure, after a completed etch of first passivation layer 360. As shown, passivation layer 360 provides a substantially uniform surface, over which a second passivation layer is subsequently applied, as illustrated in FIG. 9E Passive devices 350 remain covered, while surfaces 334 are exposed. Finally, first passivation layer 360 is beveled at the edge, creating a smooth transition from the height of surfaces 334 to the height of substrate upper surface 312.

Prior to application of a second passivation layer, a surface preparation step should be performed on the structure illustrated in FIG. 9D, such as a cleaning step using, for example, a nonpolar solvent such as xylene, followed by a polar solvent such as isopropyl alcohol (IPA), followed by a vacuum bake at approximately 100° C. for a duration of approximately one to four hours, followed by a surface ash step, such as an $O_2$/Ar or water down stream plasma ash, preferably for a duration of approximately 5 minutes.

FIG. 9E illustrates a final passivated substrate assembly, per an embodiment of the present invention, including second passivation layer 370. Second passivation layer 370 is similar to layer 170, described herein in detail with reference to FIGS. 1A and 1B. Second passivation layers 370 and 170 may, in general, differ in topology due to differences in the underlying topology created by first passivation layers 360 and 160, respectively. Otherwise, second passivation layers 370 and 170 are identical: the purposes, materials, and fabrication methods of layer 170 also apply to layer 370.

Figure 10A:
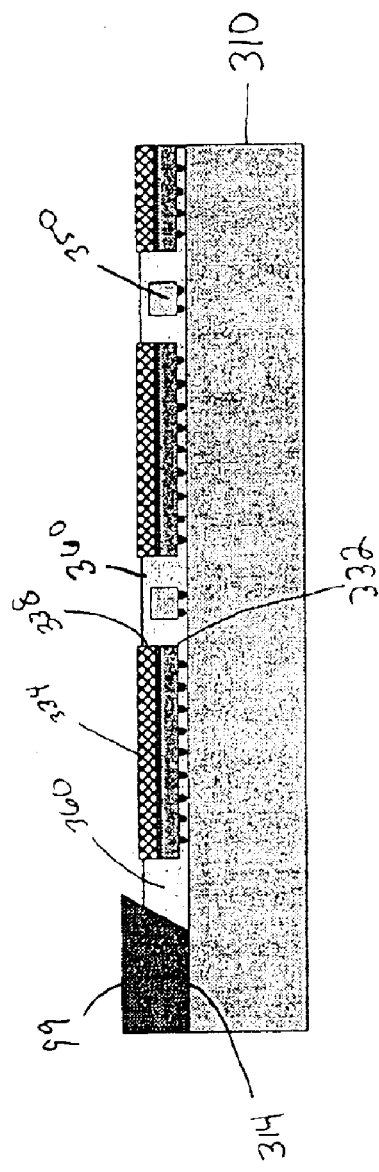
FIGS. 10A and 10B depict an alternative production process using spacers, per an embodiment of the present invention.
Figure 10B:
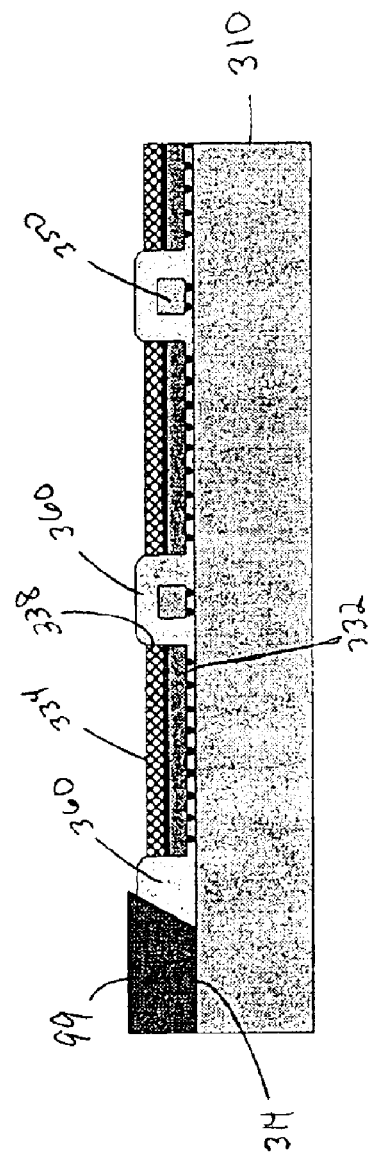

FIGS. 10A and 10B illustrate an alternative spacer process, per an embodiment of the present invention. In the process embodiment illustrated in FIG. 10, the etch step is eliminated through the initial application of a controlled amount of passivation material. Thus, as with the mold process embodiment discussed with reference to FIGS. 7 and 8, the primary exposure of device assembly upper surfaces is accomplished substantially concurrently with the application of first passivation layer material. As shown in FIG. 10A, perimeter frame 99 is placed in contact with substrate 310, at substrate perimeter 314. Perimeter frame 99 is beveled, to create an edge bevel in first passivation layer 360. As in the embodiment of FIG. 3 and FIG. 9, spacers 338 are attached to devices 332, making upper surfaces 334 higher than passive devices 350. As previously noted, suitable elastomeric materials for layer 360 are, for example: silicones (such as a silicone sold under the trademark SYLGARD® 577), acrylic elastomers, thermoplastic elastomers, thermoplastic copolymers, polysulfide polymers, and polyurethanes. Other materials having the properties described herein may be substituted by one of skill in the art, and are therefore within the spirit and scope of the present invention. In the process embodiment of FIG. 10, first passivation material, such as a silicone, for example, is poured into the volume defined by substrate 310 and perimeter frame 99. The liquid passivation material flows around and under device assemblies 330 and passive devices 350, rising to substantially the same level at all locations on substrate 310. The pour process is controlled such that it deposits an amount of material greater than or equal to a predetermined minimum, and less than or equal to a predetermined maximum. The minimum pour condition is illustrated in FIG. 10A, where the upper surface of first passivation layer 360 is below surfaces 334. The amount by which first passivation layer 360 may be below surfaces 334 is primarily controlled by the ability of second passivation layer 370 to cover the step formed at the junction of layer 360 and surface 334, without cracks, gaps, or discontinuities. This amount may vary depending on the type of material used for layer 370, the thickness of layer 370, or the method used to deposit layer 370. The maximum pour condition is illustrated in FIG. 10B, where the upper surface of first passivation layer 360 is above surfaces 334. The amount by which first passivation layer 360 may be above surfaces 334 is primarily controlled by the surface tension of the material used to form layer 360. As shown in FIG. 10B, as the liquid passivation material is poured onto substrate 310, the surface tension of the liquid passivation material causes a meniscus to form as the liquid level rises above surfaces 334. As a result, liquid may be poured to a level above surfaces 334, provided the surface tension of the liquid remains unbroken. Once the pour is complete, the passivation material is cured, forming a solid passivation layer. Once layer 360 is cured, perimeter frame 99 is removed. An optional cleaning step may then be performed, to insure that surfaces 334 are free passivation or other material, such as a cleaning step using, for example, a nonpolar such as xylene, followed by a polar solvent such as isopropyl alcohol (IPA), followed by a vacuum bake at approximately 100° C. for a duration of approximately one to four hours, followed by a surface ash step, such as an $O_2$/Ar or water down stream plasma ash, preferably for a duration of approximately 5 minutes. Finally, second passivation layer 370 is applied, as previously described with reference to FIG. 1 (layer 370 is not shown in FIG. 10).

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. An electronic module substrate assembly comprising:
   a substrate;
   at least one electronic device assembly to be cooled, said at least one electronic device assembly having a semiconductor chip, said semiconductor chip being electrically connected to said substrate;
   a first passivation layer, said first passivation layer substantially occupying the volume adjacent to said at least one electronic device assembly;
   a second passivation layer, said second passivation layer being sealably affixed to said substrate at its periphery and providing an impermeable barrier, said second passivation layer further being thermally coupled to an upper surface of one or more of said at least one electronic device assembly.

2. The apparatus of claim 1, further comprising one or more passive electronic devices connected to said substrate, said first passivation layer substantially occupying the volume around said one or more passive devices, said first passivation layer further covering an upper surface of said one or more passive devices.

3. The apparatus of claim 1, wherein said first passivation layer is formed of material selected from the group consisting of silicones, acrylic elastomers, thermoplastic elastomers, thermoplastic copolymers, polysulfide polymers and polyurethanes, thermoplastic polyimides, photosensitive polyimides, polyethersulfones and epoxies.

4. The apparatus of claim 1, wherein said first passivation layer comprises two or more sub-layers, said two or more sub-layers being composed of different materials.

5. The apparatus of claim 1, wherein said second passivation layer is metal.

6. The apparatus of claim 1, wherein said at least one electronic device assembly further comprises a spacer thermally bonded to an upper surface of said semiconductor chip.

7. The apparatus of claim 4, wherein said first passivation layer substantially occupies a volume under said at least one electronic device assembly.

8. The apparatus of claim 5, wherein said second passivation layer comprises two or more sub-layers, said two or more sub-layers being composed of different materials.

9. The apparatus of claim 5, wherein said metal is selected from the group consisting of copper, chrome, gold, nickel, titanium, and alloys thereof.

10. The apparatus of claim 6, having a plurality of said electronic device assemblies, each of said plurality of electronic device assemblies having one of said spacers thermally bonded to an upper surface of said semiconductor chip.

11. The apparatus of claim 6, wherein said spacers are composed of a material selected from the group consisting of silicon, silicon carbide, aluminum nitride, and diamond.

12. The apparatus of claim 6, wherein an upper surface of said spacer is greater in area than said upper surface of said semiconductor chip.

13. The apparatus of claim 10, wherein said spacers vary in thickness according to the thickness of said semiconductor chips, thin spacers being attached to thick chips and thick spacers being attached to thin chips.

14. An electronic module comprising:
    a substrate;
    at least one electronic device assembly to be cooled, said at least one electronic device assembly having a semiconductor chip, said semiconductor chip being electrically connected to said substrate;
    a first passivation layer, said first passivation layer substantially occupying the volume adjacent to said at least one electronic device assembly;
    a second passivation layer, said second passivation layer being sealably affixed to said substrate at its periphery and providing an impermeable barrier, said second passivation layer further being thermally coupled to an upper surface of one or more of said at least one electronic device assembly; and
    a module cap sealably affixed to said substrate, said cap and said substrate forming a volume capable of containing a cooling fluid.

15. The apparatus of claim 14, further comprising a cooling fluid.

16. The apparatus of claim 14, wherein said module further comprises at least one fluid inlet and at least one fluid outlet.

17. The apparatus of claim 15, wherein said cooling fluid is an aqueous fluid.

18. A method of passivating an electronic module substrate assembly, said electronic module substrate assembly having a substrate and at least one electronic device assembly, said method comprising the steps of:
    applying a first passivation layer, wherein the first passivation layer substantially occupies the volume adjacent to said at least one electronic device assembly;
    exposing an upper surface of said at least one electronic device assembly;
    depositing a second passivation layer over said first passivation layer and over said exposed device assembly upper surface, wherein said second passivation layer is sealably affixed to said substrate at its periphery and provides an impermeable barrier, and said second passivation layer is further thermally coupled to an upper surface of one or more of said at least one electronic device assembly.

19. The method of claim 18, wherein said second passivation layer is metal.

20. The method of claim 18, wherein said applying is performed uniformly over said electronic module substrate assembly.

21. The method of claim 18, wherein said applying is performed selectively over said electronic module substrate assembly, excluding one or more of said at least one electronic device assemblies.

22. The method of claim 20, wherein said exposing is selectively performed over said one or more electronic device assemblies.

23. The method of claim 20, wherein said exposing is performed uniformly over said electronic module substrate assembly.

24. The method of claim 21, wherein said applying and said exposing are performed substantially concurrently.

25. The method of claim 21, wherein said applying is performed using a mold.

26. The method of claim 21, wherein said applying is a controlled pour process.

27. The method of claim 22, wherein said exposing is a photolithographic process.

28. The method of claim 22, wherein said exposing is an etch process.

29. The method of claim 23, wherein said one or more electronic device assemblies includes a spacer.

* * * * *